United States Patent
Ishizuka

(10) Patent No.: US 11,152,585 B2
(45) Date of Patent: Oct. 19, 2021

(54) OPTICAL DEVICE

(71) Applicant: PIONEER CORPORATION, Tokyo (JP)

(72) Inventor: Shinichi Ishizuka, Kawagoe (JP)

(73) Assignee: PIONEER CORPORATION, Tokyo (JP)

( * ) Notice: Subject to any disclaimer, the term of this patent is extended or adjusted under 35 U.S.C. 154(b) by 14 days.

(21) Appl. No.: 16/497,723

(22) PCT Filed: Mar. 13, 2018

(86) PCT No.: PCT/JP2018/009626
§ 371 (c)(1),
(2) Date: Sep. 25, 2019

(87) PCT Pub. No.: WO2018/180444
PCT Pub. Date: Oct. 4, 2018

(65) Prior Publication Data
US 2020/0020874 A1    Jan. 16, 2020

(30) Foreign Application Priority Data
Mar. 27, 2017  (JP) .............................. JP2017-060829

(51) Int. Cl.
*H01L 51/52*       (2006.01)
*H05B 45/00*       (2020.01)
*H05B 33/26*       (2006.01)

(52) U.S. Cl.
CPC ........ *H01L 51/5203* (2013.01); *H01L 51/524* (2013.01); *H05B 33/26* (2013.01); *H05B 45/60* (2020.01); *H01L 2251/5307* (2013.01)

(58) Field of Classification Search
CPC . H01L 25/0657; H01L 25/073; H01L 23/053; H01L 23/043; H01L 23/3738;
(Continued)

(56) References Cited

U.S. PATENT DOCUMENTS 8,319,419 B2    11/2012    Kodama et al.
9,399,428 B2    7/2016    Yoshida et al.
(Continued)

FOREIGN PATENT DOCUMENTS

JP    2005-092006 A    4/2005
JP    2011-018507 A    1/2011
(Continued)

OTHER PUBLICATIONS

International Search Report for related International Application No. PCT/JP2018/009626, dated Jun. 12, 2018; 2 pages.

*Primary Examiner* — Edward Chin
(74) *Attorney, Agent, or Firm* — Procopio, Cory, Hargreaves & Savitch LLP

(57) ABSTRACT

An optical device (30) includes a light-emitting device (10) and a sensor device (20) (light-receiving element (220)). The light-emitting device (10) includes a substrate (100), a plurality of light-emitting portions (140), and light-transmitting portions (106). The light-emitting portions (140) are located at a first surface (100a) side of the substrate (100). The light-emitting portion (140) has a light-shielding portion (102: first light-shielding portion). The light-shielding portion (102) is located at a position to cover light emitted from the adjacent light-emitting portion (140: first light-emitting portion) and emitted to the first surface (100a) side at at least any angle between 70° to 90° from the light-emitting device (10).

20 Claims, 19 Drawing Sheets

(58) Field of Classification Search
CPC ..... H01L 23/481; H01L 23/473; H01L 24/73; H01L 2225/06513; H01L 2225/06572; H01L 2224/16146; H01L 2224/1703; H01L 2224/73204; H01L 24/83; H01L 2224/16235; H01L 2224/17181; H01L 2224/33181; H01L 2224/73203; H01L 2924/15153; H01L 2224/81895; H01L 2224/83102; H01L 24/33; H01L 2224/16227; H01L 2224/2929; H01L 24/29; H01L 2224/32145; H01L 2224/32225; H01L 24/13; H01L 24/16; H01L 2224/13025; H01L 2224/29387; H01L 24/32; H01L 2224/73253; H01L 2224/29191; H01L 2224/29188; H01L 2224/29186; H01L 2224/29187; H01L 2224/2919; H01L 24/17; H01L 2225/06541; H01L 2225/06589; H01L 2225/06517; H01L 2224/29147; H01L 2924/01029
See application file for complete search history.

(56) References Cited

U.S. PATENT DOCUMENTS

| | | | |
|---|---|---|---|
| 9,647,232 B2 | 5/2017 | Kakizoe et al. | |
| 10,090,488 B2 | 10/2018 | Yoshida et al. | |
| 2004/0140961 A1* | 7/2004 | Cok | H01L 27/323 345/175 |
| 2010/0314616 A1* | 12/2010 | Kodama | H01L 51/5225 257/40 |
| 2013/0214301 A1* | 8/2013 | Yamada | H01L 51/5262 257/88 |
| 2015/0298602 A1* | 10/2015 | Yoshida | G02B 5/09 362/549 |
| 2015/0340650 A1* | 11/2015 | Kakizoe | H01L 51/5203 315/313 |
| 2016/0218239 A1* | 7/2016 | Gubser | H01L 24/97 |
| 2016/0233283 A1* | 8/2016 | Kim | H01L 51/529 |
| 2016/0315289 A1 | 10/2016 | Yoshida et al. | |
| 2017/0054111 A1* | 2/2017 | Kim | H01L 27/3276 |

FOREIGN PATENT DOCUMENTS

| | | |
|---|---|---|
| JP | 2011-023336 A | 2/2011 |
| JP | 2014-154211 A | 8/2014 |
| JP | 2015-195173 A | 11/2015 |
| JP | 2016-181361 A | 10/2016 |
| JP | 2017-004747 A | 1/2017 |
| JP | 2017-007310 A | 1/2017 |
| WO | 2014-073071 A1 | 5/2014 |

* cited by examiner

FIG. 6
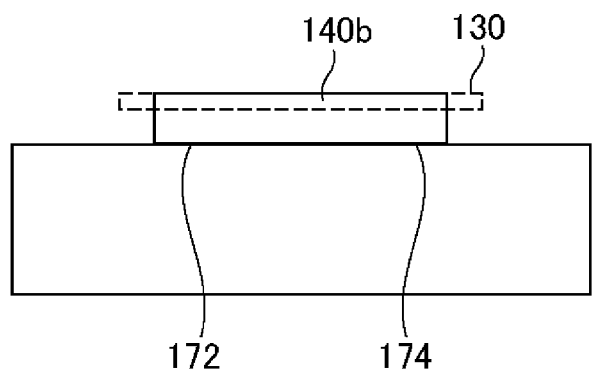
(A)
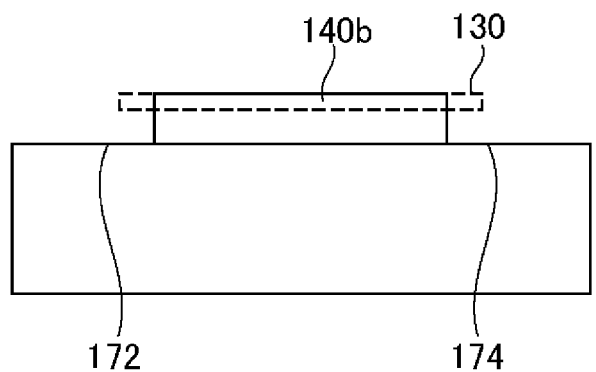
(B)
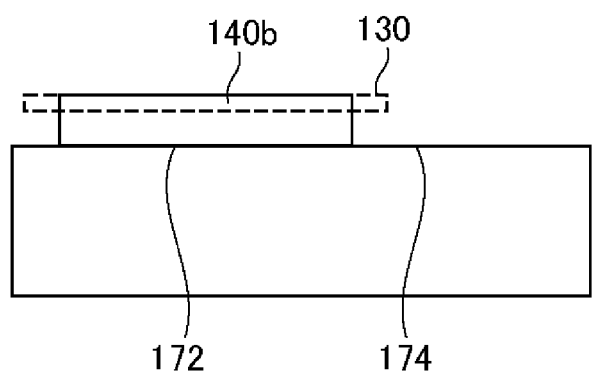
(C)
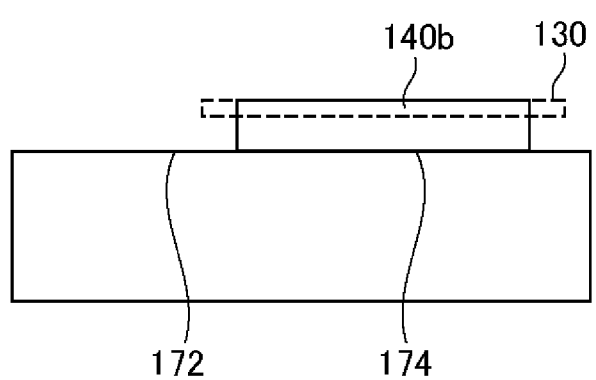
(D)

OPTICAL DEVICE

CROSS-REFERENCE TO RELATED APPLICATIONS

This application is a U.S. National Stage entry of PCT Application No: PCT/JP2018/009626 filed Mar. 13, 2018, which claims priority to Japanese Patent Application No. 2017-060829, filed Mar. 27, 2017, the contents of which are incorporated herein by reference.

TECHNICAL FIELD

The present invention relates to an optical device.

BACKGROUND ART

In recent years, studies have been conducted on providing a light-transmitting property to a light-emitting device using an organic light-emitting layer having a light-transmitting property. For example, a light-emitting device described in Patent Document 1 includes a substrate, a first electrode, an organic layer, and a plurality of second electrodes. The first electrode and the organic layer are sequentially laminated on the substrate. The plurality of second electrodes is, for example, aluminum films, and is arranged on the organic layer in a stripe pattern. Light from the outside of an OLED can be transmitted through a region between the adjacent second electrodes. Accordingly, the OLED has a light-transmitting property.

Patent Document 2 describes the use of a light-emitting device that is provided with a light-transmitting property by having opaque electrodes formed into stripes, for a stop lamp of a vehicle.

RELATED DOCUMENT

Patent Document

[Patent Document 1] Japanese Unexamined Patent Publication No. 2011-23336

[Patent Document 2] Japanese Unexamined Patent Publication No. 2015-195173

SUMMARY OF THE INVENTION

Technical Problem

As described above, in recent years, light-emitting devices having a light-transmitting property have been developed. In certain applications (for example, tail lamps of vehicles), this light-emitting device (light-emitting portions) is used together with a device (for example, an optical sensor or an imaging device) having a light-receiving element (for example, a photodiode (PD)) in some cases. In this case, it is necessary to reduce erroneous detection of the light-receiving element due to the light emitted from the light-emitting device as much as possible.

An example of problems to be solved by the present invention is to reduce erroneous detection of a light-receiving element due to the light emitted from a light-emitting portion.

Solution to Problem

An invention according to claim 1 is an optical device including:
a substrate;
a first light-emitting portion located at a first surface side of the substrate;
a first light-shielding portion located at a position to cover light emitted from the first light-emitting portion and emitted to the first surface side of the substrate at at least any angle of 70° to 90°;
a first light-transmitting portion located between the first light-emitting portion and the first light-shielding portion; and
a light-receiving element.

An invention according to claim 4 is an optical device including:
a substrate;
a first light-emitting portion located at a first surface side of the substrate;
a first light-shielding portion provided to the substrate;
a first light-transmitting portion located between the first light-emitting portion and the first light-shielding portion; and
a light-receiving element,
in which, the following formula is satisfied where t is a thickness of the substrate, n is a refractive index of the substrate, L is a width of the first light-shielding portion, and P is a distance from a center of the first light-emitting portion to a center of the first light-shielding portion;

$$(1/N) \times 2t \times \tan\theta_1 - (L/2) \le P \le (1/N) \times 2t \times \tan\theta_2 + (L/2)$$

where $\theta_1$ is $\sin^{-1}(1.0 \times \sin(70°))$, $\theta_2$ is $\sin^{-1}(1.0 \times \sin(90°))/n$, and N is a natural number.

BRIEF DESCRIPTION OF THE DRAWINGS

The foregoing and other objects, features, and advantages will become more apparent from the preferred embodiments described below and the following drawings associated therewith.

FIGS. 6(A) to 6(D) are views illustrating the width of a second electrode and the positions of a first radiation position and a second radiation position.

DESCRIPTION OF EMBODIMENTS

Figure 1:
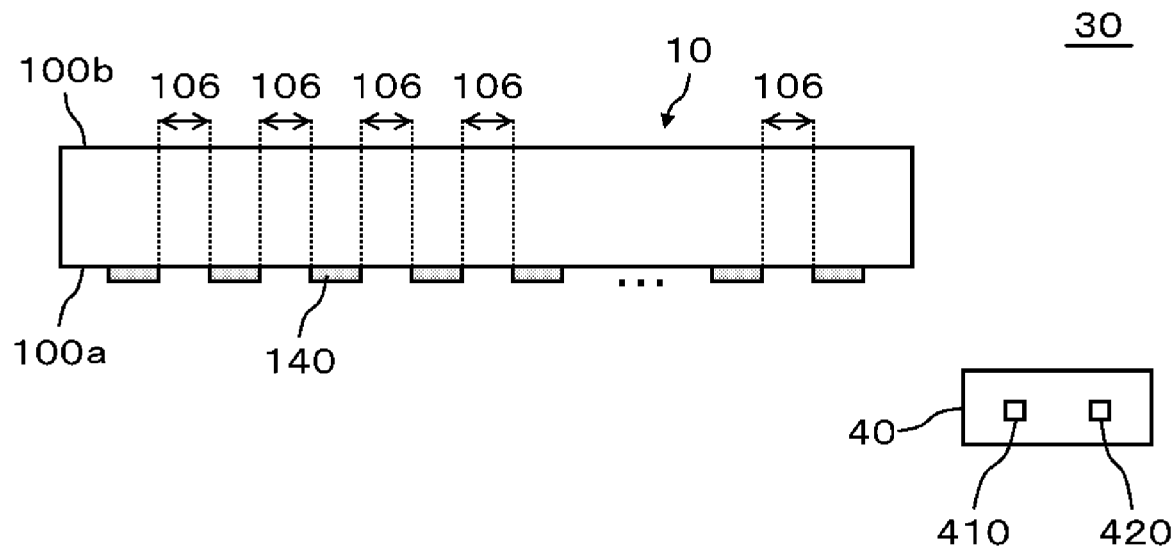
FIG. 1 is a diagram for explaining an optical device according to Embodiment 1.

Hereinafter, embodiments of the present invention will be described with reference to the drawings. In all the drawings, like elements are denoted by like reference numerals, and the description thereof will not be repeated.

Embodiment 1

FIG. 1 is a diagram for explaining an optical device 30 according to Embodiment 1. The optical device 30 includes a light-emitting device 10 and a sensor device 40 (a light-receiving element 420).

The light-emitting device 10 includes a substrate 100, a plurality of light-emitting portions 140, and a plurality of light-transmitting portions 106. The substrate 100 has a first surface 100a and a second surface 100b. The second surface 100b is opposite to the first surface 100a. The plurality of light-emitting portions 140 is located at the first surface 100a side of the substrate 100. Each of the plurality of light-transmitting portions 106 is located between the adjacent light-emitting portions 140. The light-emitting device 10 has a light-transmitting property by the plurality of light-transmitting portions 106.

The light-emitting device 10 illustrated in FIG. 1 has a configuration similar to that of the light-emitting device 10, which will be described later in detail with reference to FIG. 3 and subsequent figures. As will be described in detail with reference to FIG. 3 and subsequent figures, the light from the plurality of light-emitting portions 140 is mainly output from the second surface 100b of the substrate 100. In particular, in the present embodiment, the amount of light emitted from each of the light-emitting portions 140 and leaking from the first surface 100a side of the substrate 100 is reduced.

The sensor device 40 is provided around the light-emitting device 10. In the example illustrated in FIG. 1, the sensor device 40 is located diagonally in front of the first surface 100a of the substrate 100, and specifically, at a position that is at the first surface 100a side as viewed in a direction parallel to the substrate 100 and does not overlap with the first surface 100a or the second surface 100b as viewed in a direction perpendicular to the substrate 100. In another example, the sensor device 40 maybe in front of the first surface 100a of the substrate 100 or maybe at a side between the first surface 100a and the second surface 100b of the substrate 100. In still another example, the sensor device 40 may be located diagonally in front of the second surface 100b of the substrate 100, and specifically, at a position that is at the second surface 100b side of the substrate 100 as viewed in the direction parallel to the substrate 100 and does not overlap with the first surface 100a or the second surface 100b as viewed in the direction perpendicular to the substrate 100.

The sensor device 40 performs light sensing for acquiring information around the optical device 30. In the example illustrated in FIG. 1, the sensor device 40 includes a light-emitting element 410 and a light-receiving element 420. In one example, the sensor device 40 may be a distance measuring sensor, in particular, light detection and ranging (LiDAR). In this example, the light-emitting element 410 emits light to the outside of the sensor device 40, and the light-receiving element 420 receives the light emitted from the light-emitting element 410 and reflected by an object. In one example, the light-emitting element 410 maybe an element capable of converting electrical energy into light energy, such as a laser diode (LD), and the light-receiving element 420 maybe an element capable of converting light energy into electrical energy, such as a photodiode (PD). The sensor device 40 can detect the distance from the sensor device 40 to the object based on the time from emission of the light from the light-emitting element 410 to receipt of the light by the light-receiving element 420.

The light-receiving element 420 of the sensor device 40 detects light from the outside of the sensor device 40. Therefore, in order to prevent erroneous detection of the light-receiving element 420, it is desirable to reduce incidence of the light emitted from the light-emitting device 10 onto the light-receiving element 420 as much as possible.

The optical device 30 may be used in applications for light emission and light sensing, for example, in a tail lamp with a distance measuring sensor of a vehicle. In this example, the light-emitting device 10 realizes the function of light emission, and the sensor device 40 realizes the function of light sensing.

According to the configuration described above, erroneous detection of the light-receiving element 420 due to the light emitted from the light-emitting device 10 can be reduced. Specifically, as described above, in the present embodiment, the amount of light emitted from each of the light-emitting portions 140 and leaking from the first surface 100a side of the substrate 100 is reduced. Therefore, incidence of the light emitted from the light-emitting device 10 onto the sensor device 40 (light-receiving element 420) can be reduced. Therefore, the erroneous detection of the light-receiving element 420 due to the light emitted from the light-emitting device 10 can be reduced.

In particular, in the present embodiment, even if the sensor device 40 (the light-receiving element 420) is in front of or diagonally in front of the first surface 100a of the substrate 100, erroneous detection of the light-receiving element 420 due to the light emitted from the light-emitting device 10 can be reduced. As described above, in the present embodiment, the amount of the light emitted from each of the light-emitting portions 140 and leaking from the first surface 100a side of the substrate 100 is reduced. Therefore, leakage of the light emitted from the light-emitting device 10 to the front or diagonal front of the first surface 100a of the substrate 100 can be reduced. Therefore, even if the sensor device 20 (the light-receiving element 420) is in front of or diagonally in front of the first surface 100a of the substrate 100, erroneous detection of the light-receiving element 420 due to the light emitted from the light-emitting device 10 can be reduced.

Embodiment 2

Figure 2:
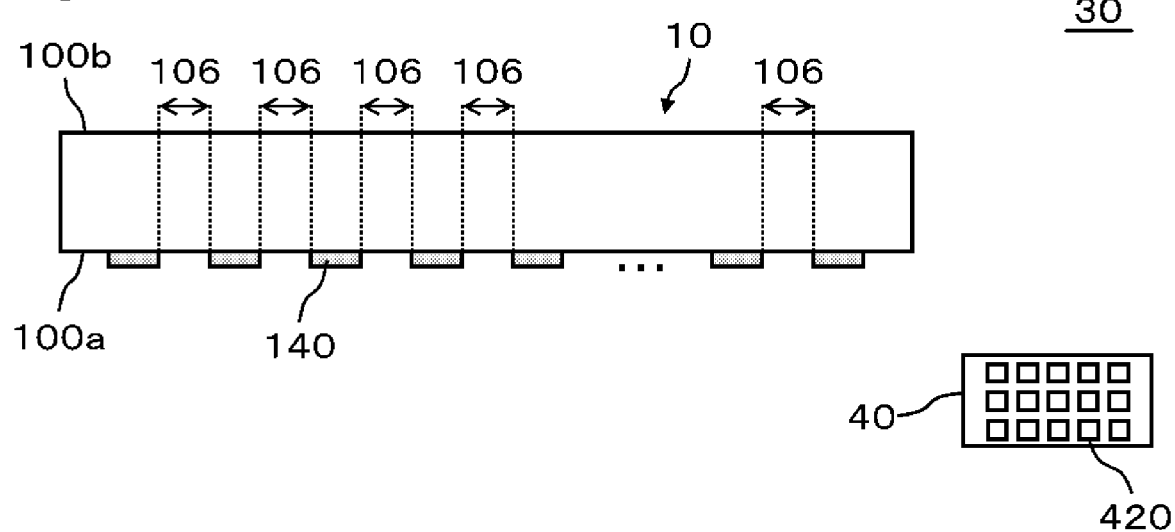
FIG. 2 is a diagram for explaining an optical device according to Embodiment 2.

FIG. 2 is a diagram for explaining an optical device 30 according to Embodiment 2, and corresponds to FIG. 1 of Embodiment 1. The optical device 30 according to the present embodiment is the same as the optical device 30 according to Embodiment 1 except for the following points.

The sensor device 40 performs light sensing for acquiring information around the optical device 30. In the example illustrated in FIG. 2, the sensor device 40 includes a plurality of light-receiving elements 420. In one example, sensor device 40 may be an imaging sensor. In this example, the plurality of light-receiving elements 420 may be elements capable of converting an image into an electrical signal, such as a charge coupled device (CCD) image sensor or a complementary metal-oxide-semiconductor (CMOS) image sensor. In one example, each of the light-receiving elements 420 may be an element capable of converting light energy into electrical energy, such as a photodiode (PD). The sensor device 40 can detect an image of an object outside the sensor device 40 by the plurality of light-receiving elements 420.

The light-receiving element 420 of the sensor device 40 detects light from the outside of the sensor device 40. Therefore, in order to prevent erroneous detection of the light-receiving elements 420, it is desirable to reduce the amount of the light emitted from the light-emitting device 10 and incident onto the light-receiving elements 420 as much as possible.

The optical device 30 may be used in applications for light emission and light sensing, for example, a tail lamp with an imaging sensor of a vehicle. In this example, the light-emitting device 10 realizes the function of light emission, and the sensor device 40 realizes the function of light sensing.

Also in the present embodiment, as in Embodiment 1, erroneous detection of the light-receiving element 420 due to the light emitted from the light-emitting device 10 can be reduced.

Embodiment 3

Figure 3:
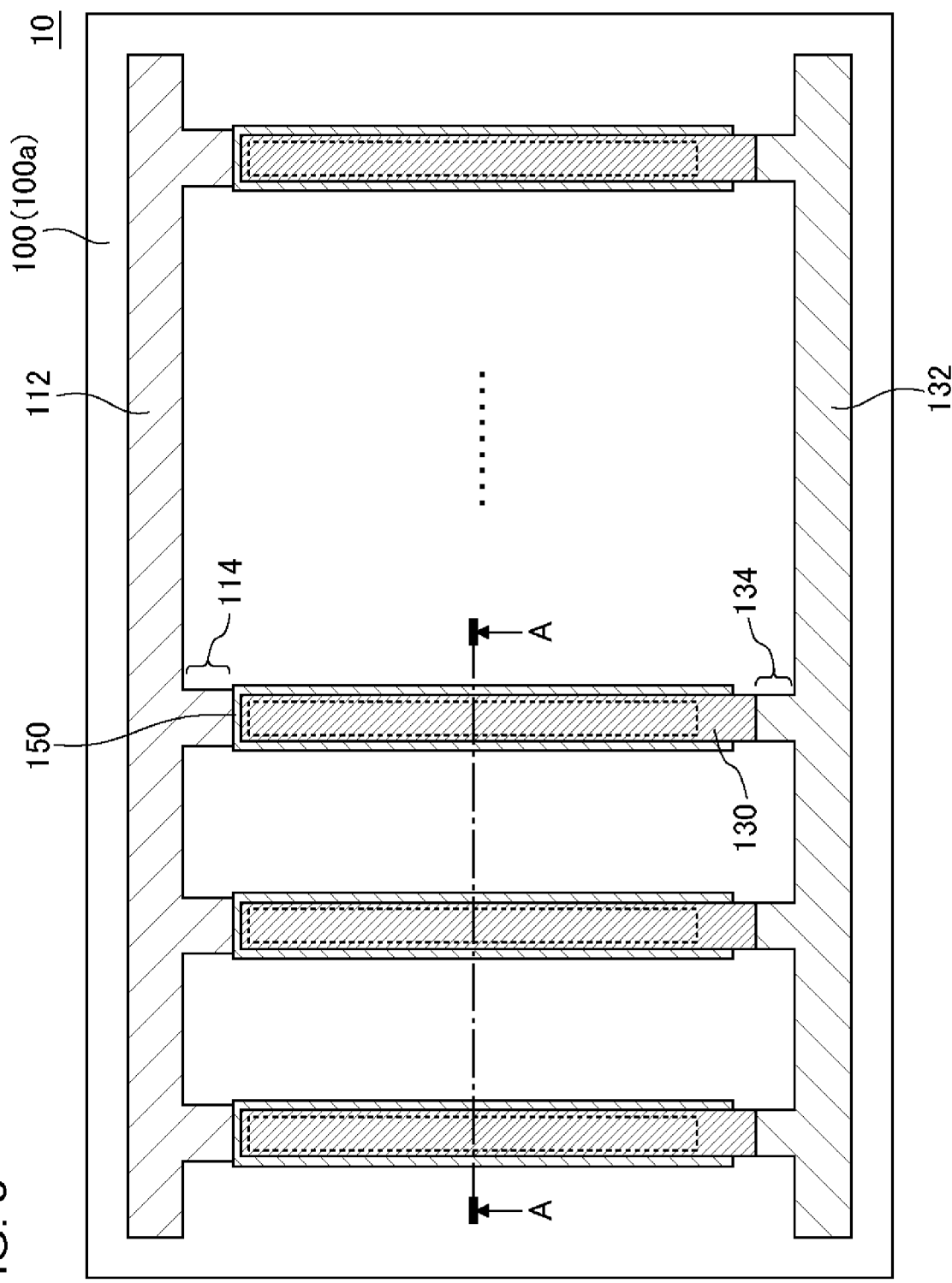
FIG. 3 is a plan view illustrating a configuration of a light-emitting device according to Embodiment 3.
Figure 4:
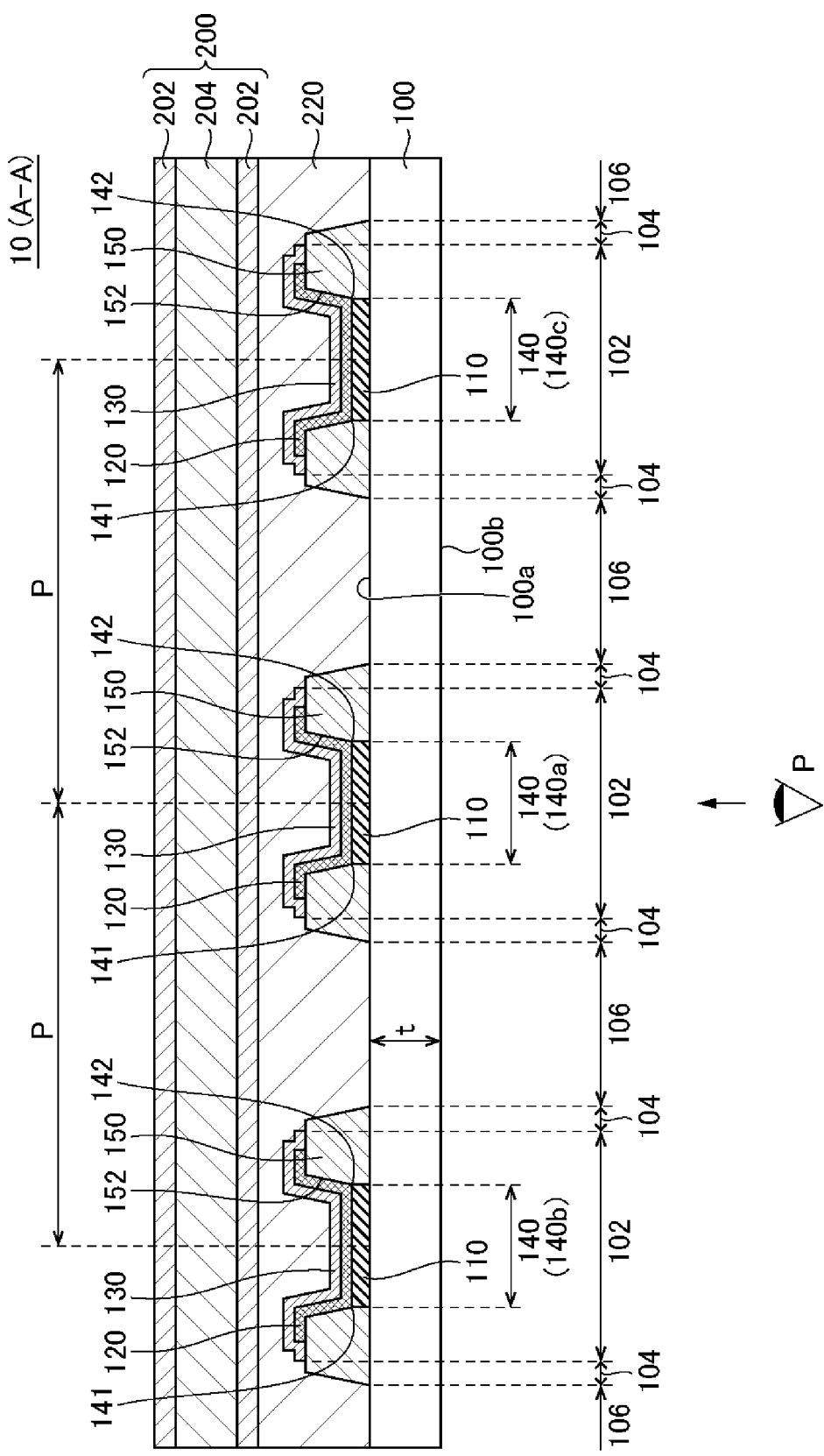
FIG. 4 is a cross-sectional view taken along line A-A of FIG. 3.

FIG. 3 is a plan view illustrating the configuration of a light-emitting device 10 according to Embodiment 3. FIG. 4 is a cross-sectional view taken along line A-A of FIG. 3. The light-emitting device 10 includes a substrate 100, a plurality of light-emitting portions 140, and light-transmitting portions 106. The light-emitting portion 140 is located at a first surface 100a side of the substrate 100. The light-emitting portion 140 has a light-shielding portion 102. The light-shielding portion 102 (first light-shielding portion) is located at a position to cover light emitted from the adjacent light-emitting portion 140 (first light-emitting portion) and emitted to the first surface 100a side at at least any angle between 70° to 90° from the light-emitting device 10.

In other words, the light-shielding portion 102 (first light-shielding portion) is located anywhere from a position to cover light emitted from an end portion 141 of the adjacent light-emitting portion 140 (first light-emitting portion) opposite to the light-shielding portion 102 and emitted from the first surface 100a side to the outside of the light-emitting device 10 at an angle of 70°, to a position to cover light emitted from an end portion 142 of the first light-emitting portion at the light-shielding portion 102 side and emitted to the first surface 100a side to the outside of the light-emitting device 10 at an angle of 90°.

As an example of the method for this, as will be described later in detail, the light-emitting portions 140 may be disposed such that the distance P from the center of the light-shielding portion 102 (first light-shielding portion) to the center of the adjacent light-emitting portion 140 (first light-emitting portion) satisfies the following formula;

$$(1/N) \times 2t \times \tan \theta_1 - (L/2) \leq P \leq (1/N) \times 2t \times \tan \theta_2 + (L/2) \quad (1)$$

where t is the thickness of the substrate 100, L is the width of the light-shielding portion 102 (first light-shielding portion), n is the refractive index of the substrate 100, $\theta_1$ is $\sin^{-1}(1.0 \times \sin)(70°/n)$, $\theta_2$ is $\sin^{-1}(1.0 \times \sin(90°/n))$, and N is a natural number.

Hereinafter, the light-emitting device 10 will be described in detail.

The light-emitting device 10 includes the plurality of light-emitting portions 140 as described above. The plurality of light-emitting portions 140 all extend linearly (for example, in a straight line shape). In the example illustrated in this figure, the plurality of light-emitting portions 140 extends parallel to each other. However, at least a part of a certain light-emitting portion 140 may not be parallel to the adjacent light-emitting portion 140. Moreover, the light-emitting portion 140 may not be linear.

The light-emitting portion 140 is formed using the substrate 100. The light-emitting portion 140 is of a bottom emission type, and radiates light from the second surface 100b side of the substrate 100.

The substrate 100 is formed of a light-transmissive material such as glass or a light-transmissive resin. The substrate is a polygon such as a rectangle, but may have another shape (for example, a circular shape). The substrate 100 has flexibility. When the substrate 100 has flexibility, the thickness of the substrate 100 is, for example, 10 μm or greater and 1000 μm or less. In particular, when the substrate 100 having glass is made flexible, the thickness of the substrate 100 is, for example, 200 μm or less. When the substrate 100 formed of a resin material is made flexible, the material of the substrate 100 is, for example, at least one of polyethylene naphthalate (PEN), polyether sulfone (PES), polyethylene terephthalate (PET), and polyimide. When the substrate 100 is formed of a resin material, it is preferable that an inorganic barrier film such as $SiN_x$ or SiON is formed on at least the light-emitting surface (preferably both surfaces) of the substrate 100 in order to reduce permeation of moisture through the substrate 100.

As described above, the light-emitting portion 140 is formed on the first surface 100a of the substrate 100, and includes a light-transmissive first electrode 110, an organic layer 120, and a light-shielding second electrode 130.

The first electrode 110 is formed of a transparent conductive film. The transparent conductive film is a material containing a metal such as a metal oxide such as Indium Tin Oxide (ITO), Indium Zinc Oxide (IZO), Indium Tungsten Zinc Oxide (IWZO), and Zinc Oxide (ZnO). The refractive index of the material of the transparent electrode is, for example, 1.5 or greater and 2.2 or less. The thickness of the transparent electrode is, for example, 10 nm or greater and 500 nm or less. The transparent electrode is formed, for example, using a sputtering method or an evaporation method. The transparent electrode may be a conductive organic material such as carbon nanotube or PEDOT/PSS, or may be a thin metal electrode.

The organic layer 120 is located between the first electrode 110 and the second electrode 130, and has a hole injection layer, a hole transport layer, a light-emitting layer, an electron transport layer, and an electron injection layer. However, one of the hole injection layer and the hole transport layer may not be formed. In addition, one of the electron transport layer and the electron injection layer may not be formed. The organic layer 120 may further have another layer. The organic layer 120 is formed using, for example, an evaporation method using a mask, but at least a part of the layer may be formed by an application method. The organic layer 120 is continuously formed on an insulating film 150, which will be described later, and a region of the first electrode 110 that is to become the light-emitting portion 140.

In the example illustrated in FIG. 4, the two end portions of the organic layer 120 are located on the insulating film 150. However, the end portions of the insulating film 150 may be located in the light-transmitting portion 106, which will be described later. The organic layer 120 of each of the plurality of light-emitting portions 140 may be connected to one another. In this case, the light-transmitting portion 106 described later is covered with the organic layer 120.

The second electrode 130 has, for example, a metal layer and does not have a light-transmitting property. The metal layer of the second electrode 130 is, for example, a layer made of a metal selected from the first group consisting of Al, Au, Ag, Pt, Mg, Sn, Zn, and In, or an alloy of the metal selected from the first group. In the example illustrated in FIG. 4, both the end portions of the second electrode 130 are located on the insulating film 150.

An insulating film 150 is formed on the first electrode 110. The insulating film 150 has an opening in the region of the first electrode 110 that is to become the light-emitting portion 140. In other words, the insulating film 150 defines the light-emitting portion 140. The insulating film 150 is formed using, for example, a material containing a photosensitive substance in polyimide or the like. The insulating film 150 is formed after the first electrode 110 is formed and before the organic layer 120 is formed.

In the example illustrated in FIG. 4, the first electrode 110 is divided for each of the light-emitting portion 140. Therefore, the end portion of the light-emitting portion 140 is covered with the insulating film 150, and the first electrode 110 is not located in the light-transmitting portion 106 described later. However, the first electrodes 110 of the plurality of light-emitting portions 140 may be connected to one another. In this case, the first electrode 110 is also located in the light-transmitting portion 106.

The light-emitting device 10 has a light-shielding portion 102 and light-transmitting portions 104 and 106.

The light-shielding portion 102 is a region overlapping with the second electrode 130. When the second electrode 130 is a light-transmissive electrode, or when the interval between adjacent light-emitting portions 140 is wide, however, a light-shielding member (for example, a light-shielding film) may be provided on the second electrode 130. In this case, the light-shielding portion 102 is a region overlapping with the light-shielding member. Furthermore, when the interval between the adjacent second electrodes 130 is wide, a light-shielding member (for example, a light-shielding film) may be provided in a region between the adjacent second electrodes 130, such as on a part of the light-transmitting portion 106. In this case, the light-shielding portion 102 includes both the region overlapping with the second electrode 130 and the region overlapping with the light-shielding film. In addition, the light-shielding member maybe disposed at a position covering the middle point of the adjacent second electrodes 130. The light-shielding member is, for example, the same metal film as the second electrode 130, but may be a film different from the second electrode 130.

The light-transmitting portion 104 is a region between the plurality of light-shielding portions 102 that includes the insulating film 150. The light-transmitting portion 106 is a region between the plurality of light-shielding portions 102 that does not include the insulating film 150. The transmittance of the light-transmitting portion 106 is lower than the transmittance of the light-transmitting portion 104. The light-transmitting portion 106 does not overlap with the first electrode 110 either. In the example illustrated in the figure, the organic layer 120 is not formed on at least a part of the light-transmitting portion 106. The width of the light-transmitting portion 104 is narrower than the width of the light-transmitting portion 106. The width of the light-transmitting portion 106 may be wider or narrower than the width of the light-shielding portion 102. Assuming the width of the light-shielding portion 102 is 1, the width of the light-transmitting portion 104 is, for example, 0 or greater (or greater than 0) 0.2 or less, and the width of the light-transmitting portion 106 is, for example, 0.3 or greater and 3 or less. The width of the light-shielding portion 102 is, for example, 50 μm or greater and 500 μm or less, the width of the light-transmitting portion 104 is, for example, 0 μm or greater (or greater than 0 μm) and 100 μm or less, and the width of the light-transmitting portion 106 is, for example, 15 μm or greater and 1000 μm or less.

The light-emitting device 10 has a plurality of light-transmitting portions 104 and 106. Therefore, the light-emitting device 10 has a light-transmitting property. The light-emitting portion 140 overlaps with the light-shielding portion 102. Therefore, a large part of the light emitted from the light-emitting portion 140 is emitted to the outside from the second surface 100b of the substrate 100 where the light-emitting portion 140 is not formed.

The light-emitting device 10 further includes a first terminal 112 and a first wire 114. The first terminal 112 is a terminal for connecting the first electrode 110 to a drive circuit outside the light-emitting device 10, to which an external wire such as a flexible printed wiring board is connected. The first wire 114 connects the first terminal 112 to the first electrode 110. The first terminal 112 and the first wire 114 are both formed on the first surface 100a. At least a part of the first terminal 112 and the first wire 114 may be integrated with the first electrode 110. In this case, at least apart of the first terminal 112 and the first wire 114 is the same transparent conductive film as the first electrode 110, and is simultaneously formed in the same process as the first electrode 110.

The first terminal 112 and a second terminal 132 extend at the edge of the substrate 100 in a direction intersecting the light-emitting portion 140 (for example, a direction orthogonal thereto). The first terminal 112 is connected to the plurality of first electrodes 110, and the second terminal 132 is connected to the plurality of second electrodes 130.

A sealing portion 200 is formed at the first surface 100a side of the substrate 100. The sealing portion 200 is provided to seal the light-emitting portion 140. In the example shown in the figure, the sealing portion 200 has a configuration in which light-transmissive barrier layers 202 are provided on both sides of a light-transmissive sealing sheet 204, and is fixed to the first surface 100a side of the substrate 100 using a light-transmissive adhesive layer 220. In other words, the sealing portion 200 is located on the light-emitting portion 140 and the insulating film 150 across the adhesive layer 220. The sealing portion 200 is located above a region that becomes the light-transmitting portion 106 of the substrate 100, across the adhesive layer 220. The adhesive layer 220 may contain a moisture-absorbing agent.

The sealing sheet 204 is made of a resin. As the resin forming the sealing sheet 204, those exemplified as the resin forming the substrate 100 can be used. The barrier layer 202 is, for example, an inorganic barrier layer such as $SiN_x$ or SiON. When the substrate 100 is a resin substrate having a barrier layer, the sealing portion 200 may have the same structure as the substrate 100.

The thickness of the sealing portion 200 is, for example, 10 μm or greater and 1000 μm or less. The thickness of the adhesive layer 220 is, for example, 5 μm or greater and 100 μm or less.

The light-emitting device 10 may include a covering layer between the light-emitting portion 140 and the sealing portion 200. The covering layer covers the light-emitting portion 140 and seals the light-emitting portion 140. The covering layer has at least one layer (preferably, a plurality of layers) made of an inorganic material (hereinafter, referred to as an inorganic layer). The inorganic material is a metal oxide such as aluminum oxide or titanium oxide. For example, the covering layer has a laminated film in which a first layer made of aluminum oxide and a second layer made of titanium oxide are repeatedly laminated. In this case, the thickness of the laminated film is, for example, 1 nm or greater and 300 nm or less. The first layer and the second layer are formed, for example, by using an atomic layer deposition (ALD) method. In this case, the thickness of the first layer and the thickness of the second layer are, for example, 1 nm or greater and 100 nm or less. The above-mentioned inorganic layer may be formed using other deposition methods, such as a CVD method and a sputtering method. In this case, the inorganic layer is, for example, a $SiO_2$ layer or a SiN layer. The film thickness of the inorganic layer is, for example, 100 nm or greater and 300 nm or less.

The light-emitting device 10 may have a hollow sealing structure as the sealing portion 200. In this case, the light-emitting device 10 has a sealing member having a recessed portion. The sealing member is fixed at the first surface 100a side of the substrate 100 such that the light-emitting portion 140 is located inside the recessed portion.

Figure 5:
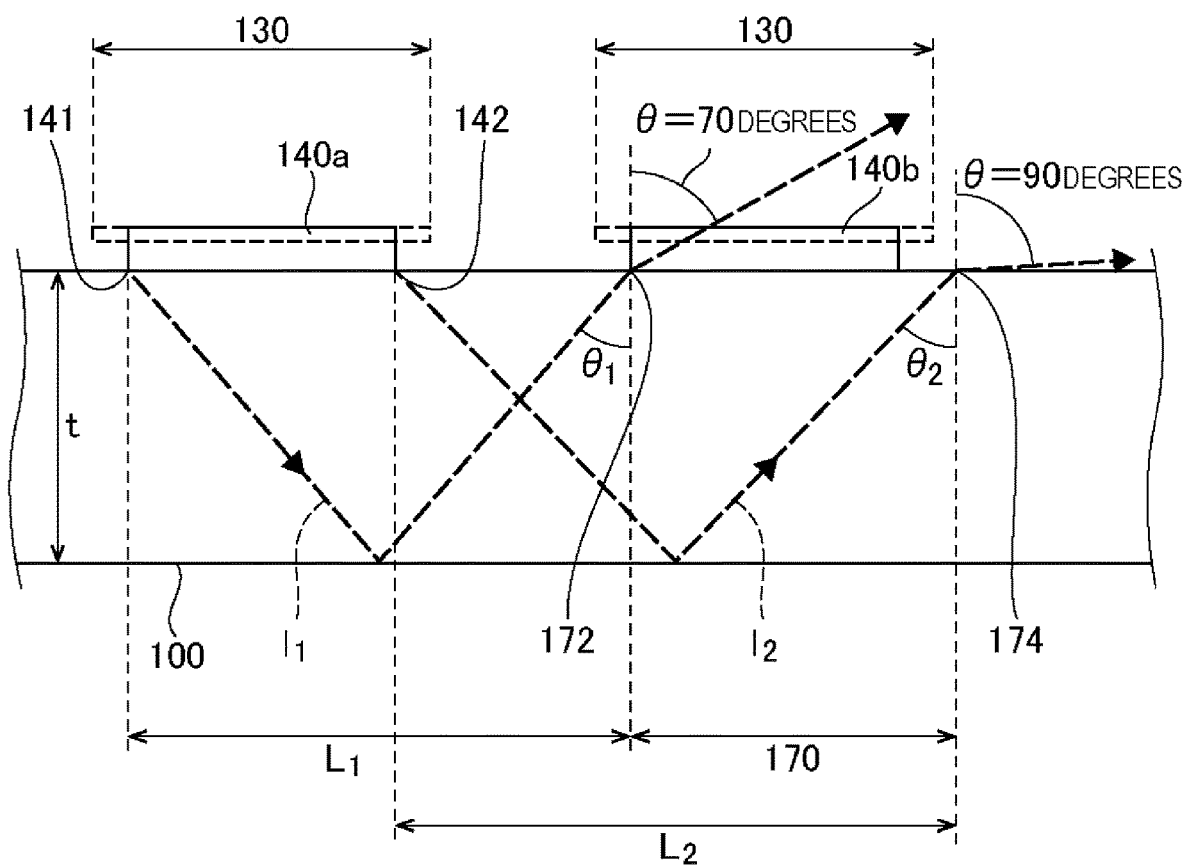
FIG. 5 is a diagram for explaining an arrangement interval of light-emitting portions.

FIG. 5 is a for explaining the arrangement interval of the light-emitting portions 140. In this figure, the light-emitting portions 140 are simplified for the explanation and the radiation directions of light are arranged. As illustrated in this figure and FIG. 4, at least a portion of the light emitted from the light-emitting portion 140 toward the second surface 100b is Fresnel-reflected on the second surface 100b and reflected toward the first surface 100a. Therefore, there is a possibility that a portion of the reflected light is radiated (light leaks) to the outside from the first surface 100a side of the light-emitting device 10.

Figure 10:
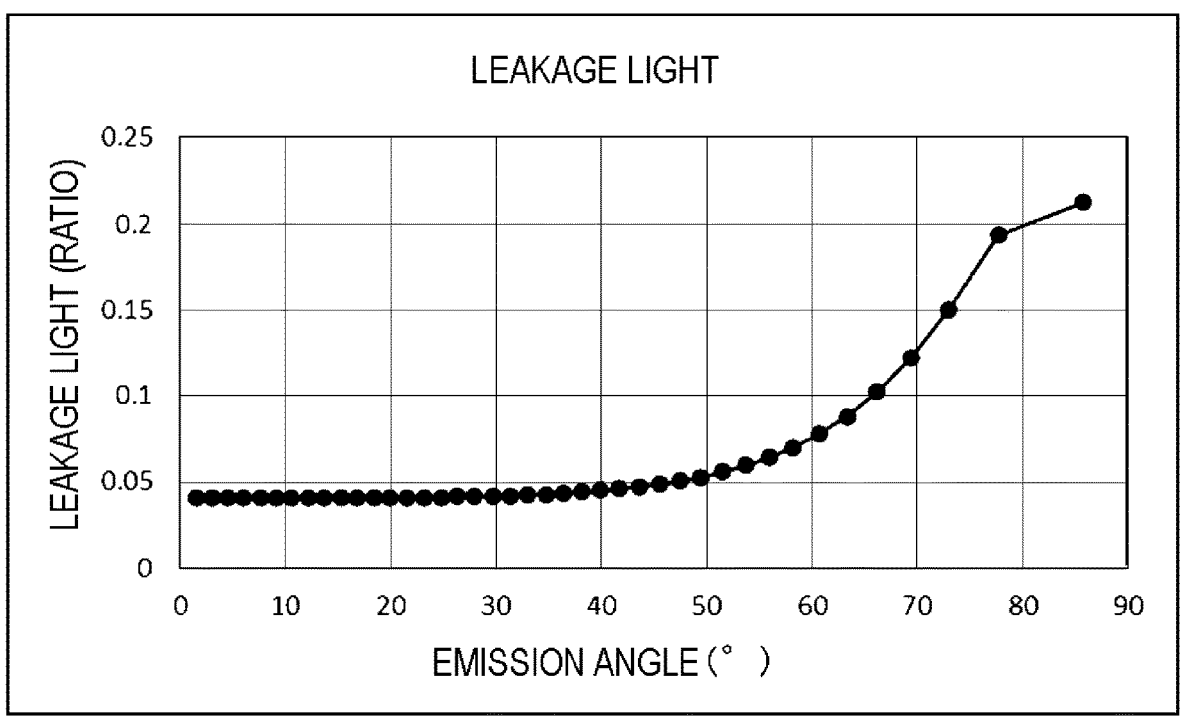
FIG. 10 is a diagram showing a simulation result of a ratio of leaking light.
Figure 11:
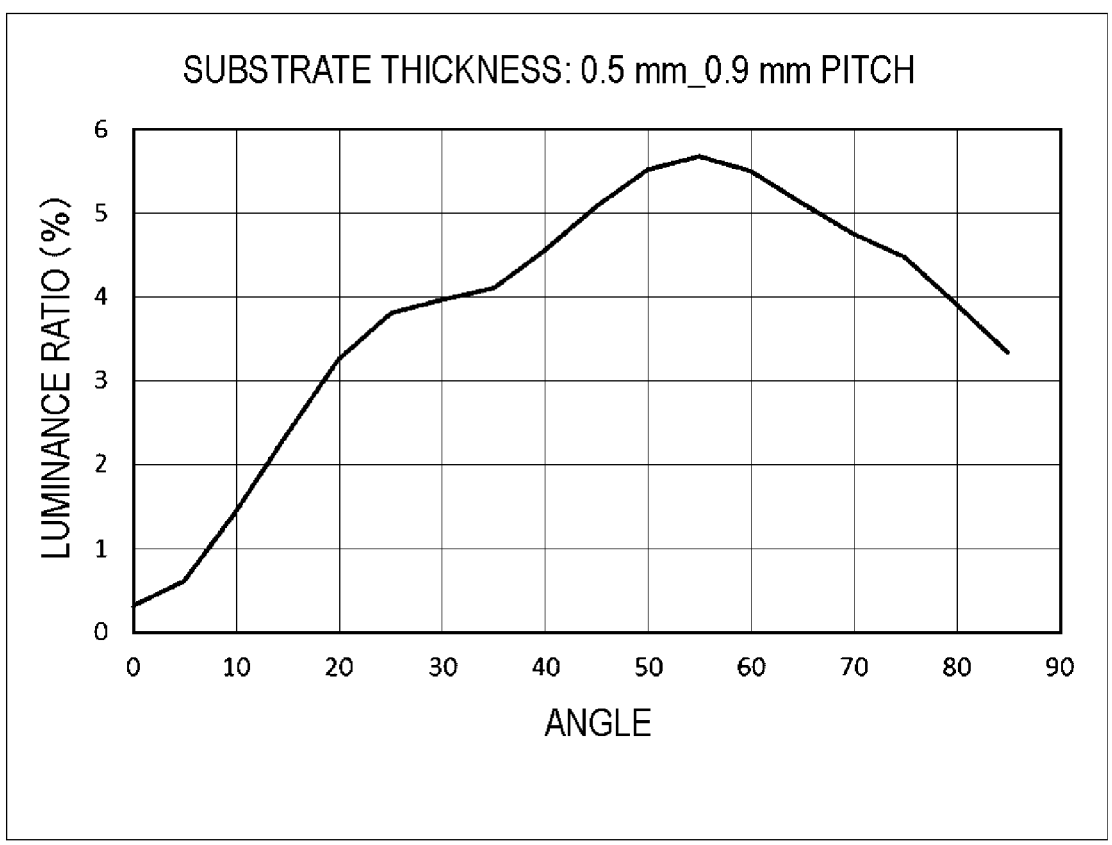
FIG. 11 is a diagram showing a relationship between the radiation angle of leaking light and the amount of leaking light.
Figure 12:
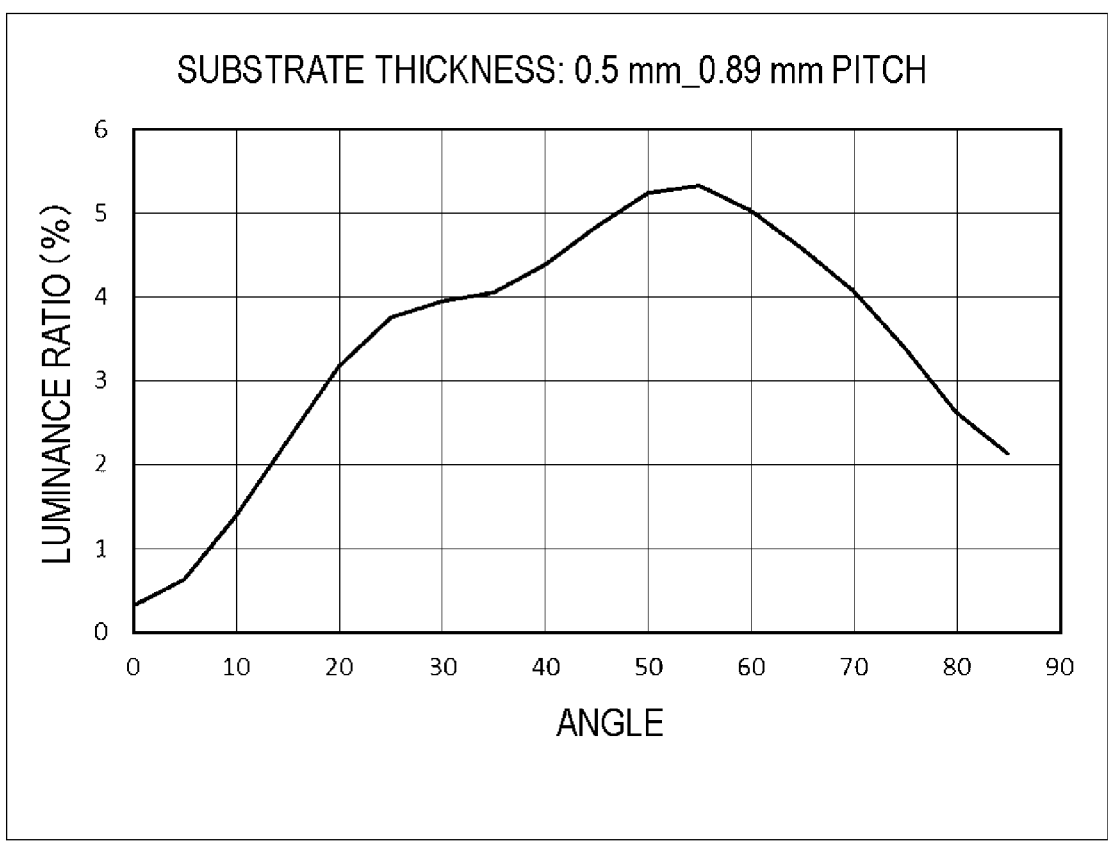
FIG. 12 is a diagram showing a relationship between the radiation angle of leaking light and the amount of leaking light.
Figure 13:
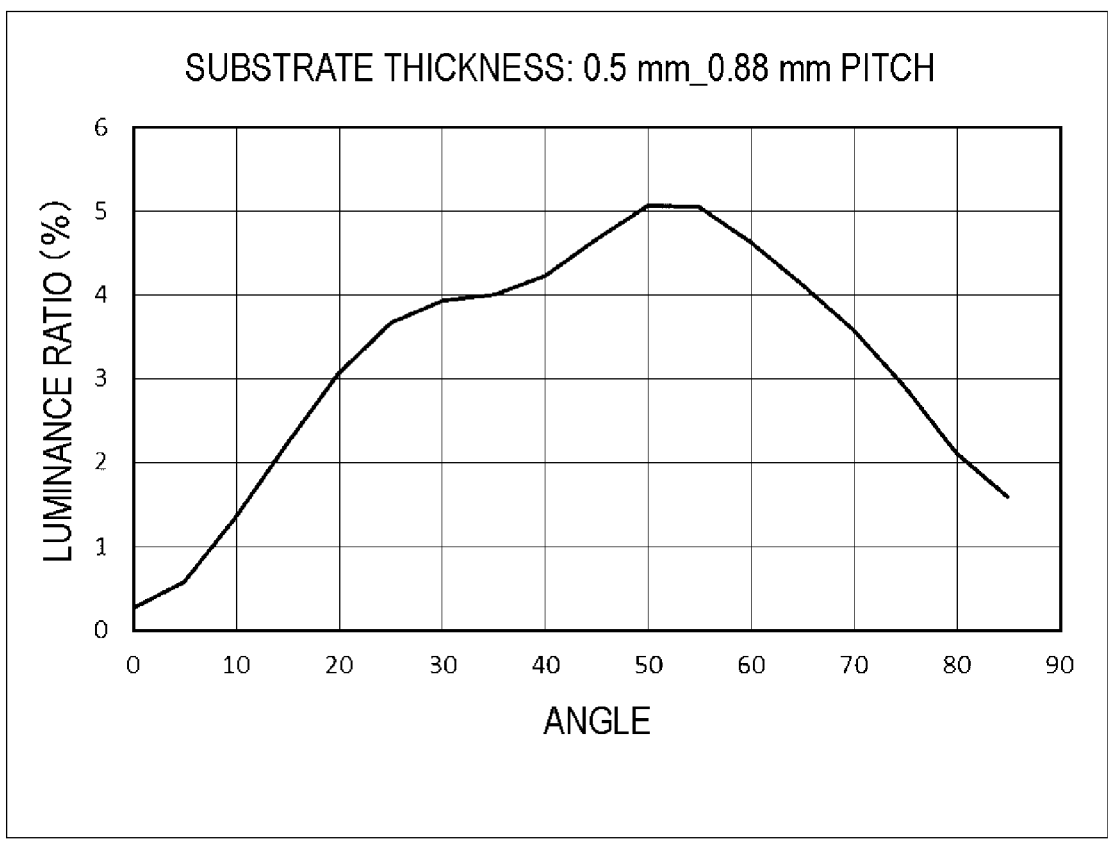
FIG. 13 is a diagram showing a relationship between the radiation angle of leaking light and the amount of leaking light.
Figure 14:
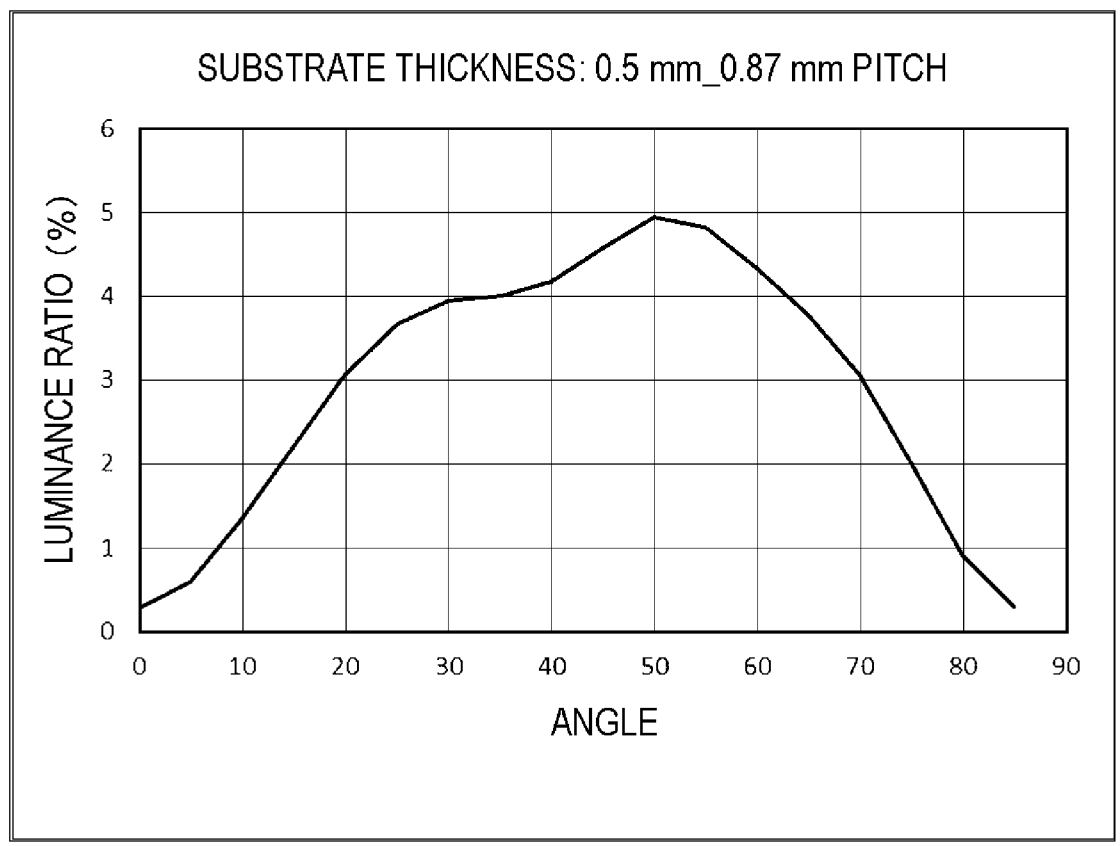
FIG. 14 is a diagram showing a relationship between the radiation angle of leaking light and the amount of leaking light.
Figure 15:
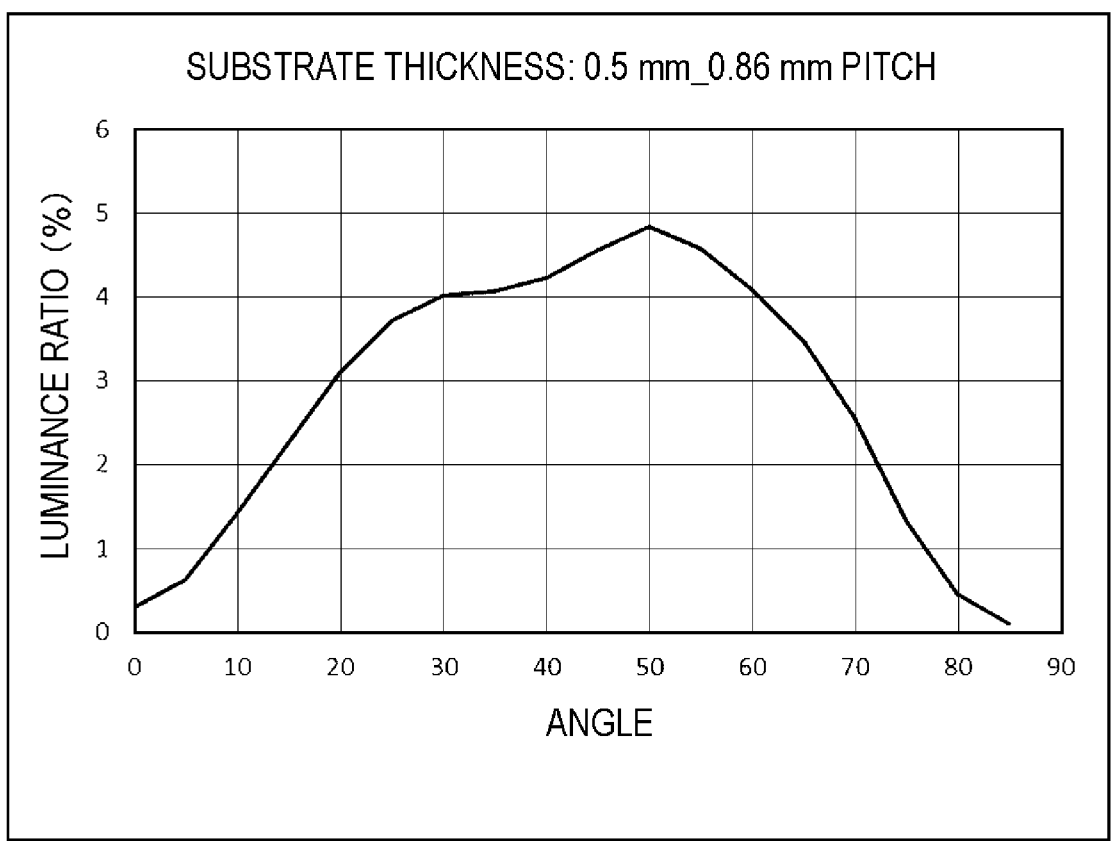
FIG. 15 is a diagram showing a relationship between the radiation angle of leaking light and the amount of leaking light.
Figure 16:
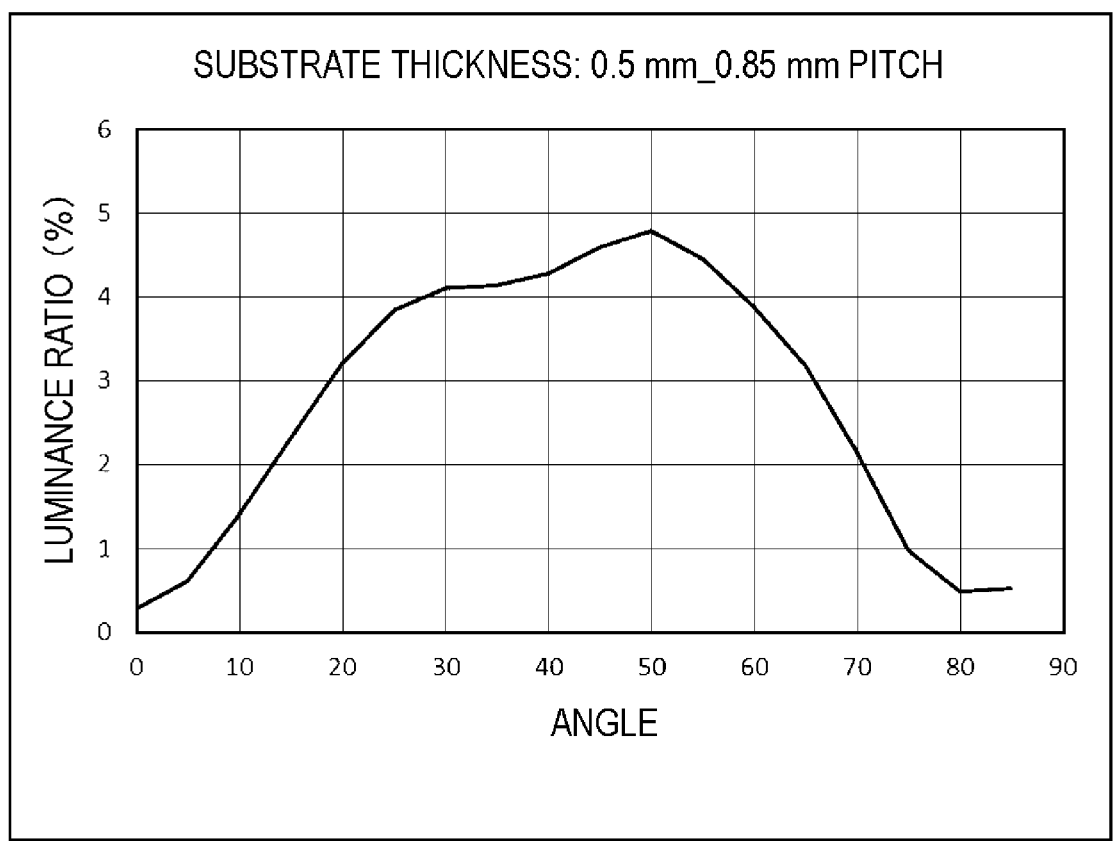
FIG. 16 is a diagram showing a relationship between the radiation angle of leaking light and the amount of leaking light.
Figure 17:
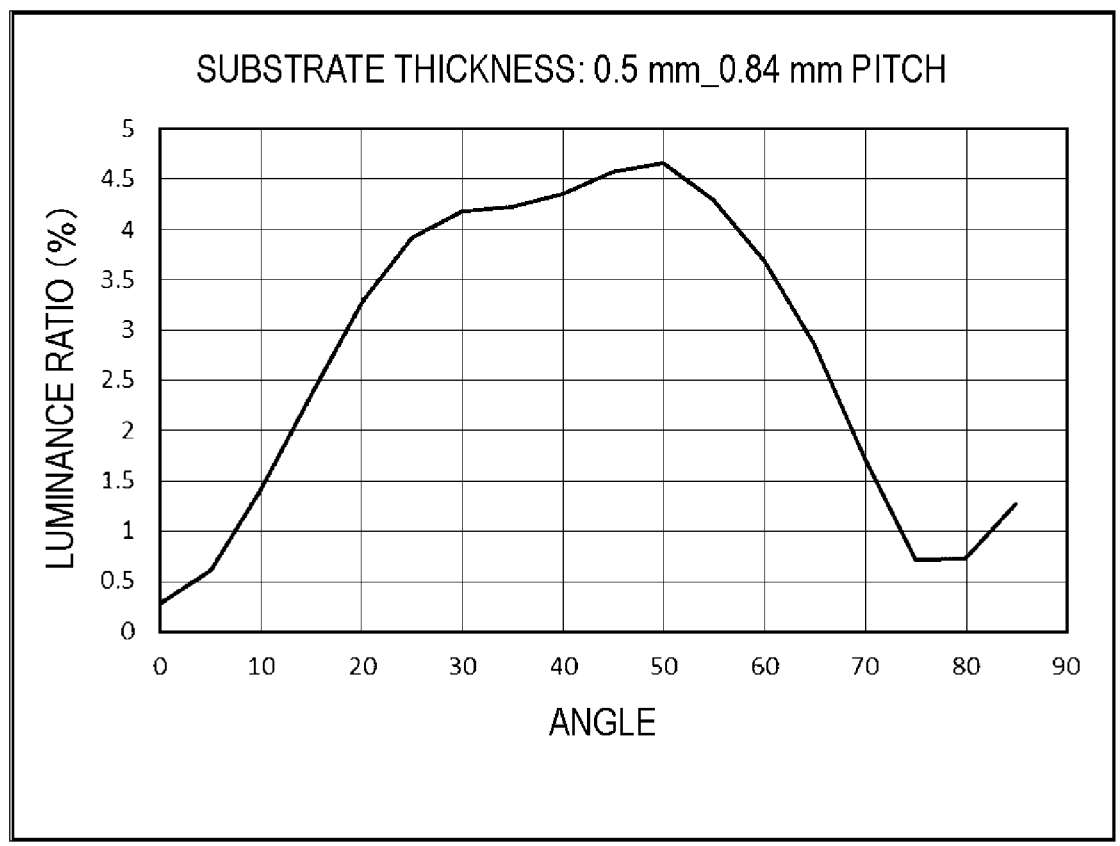
FIG. 17 is a diagram showing a relationship between the radiation angle of leaking light and the amount of leaking light.
Figure 18:
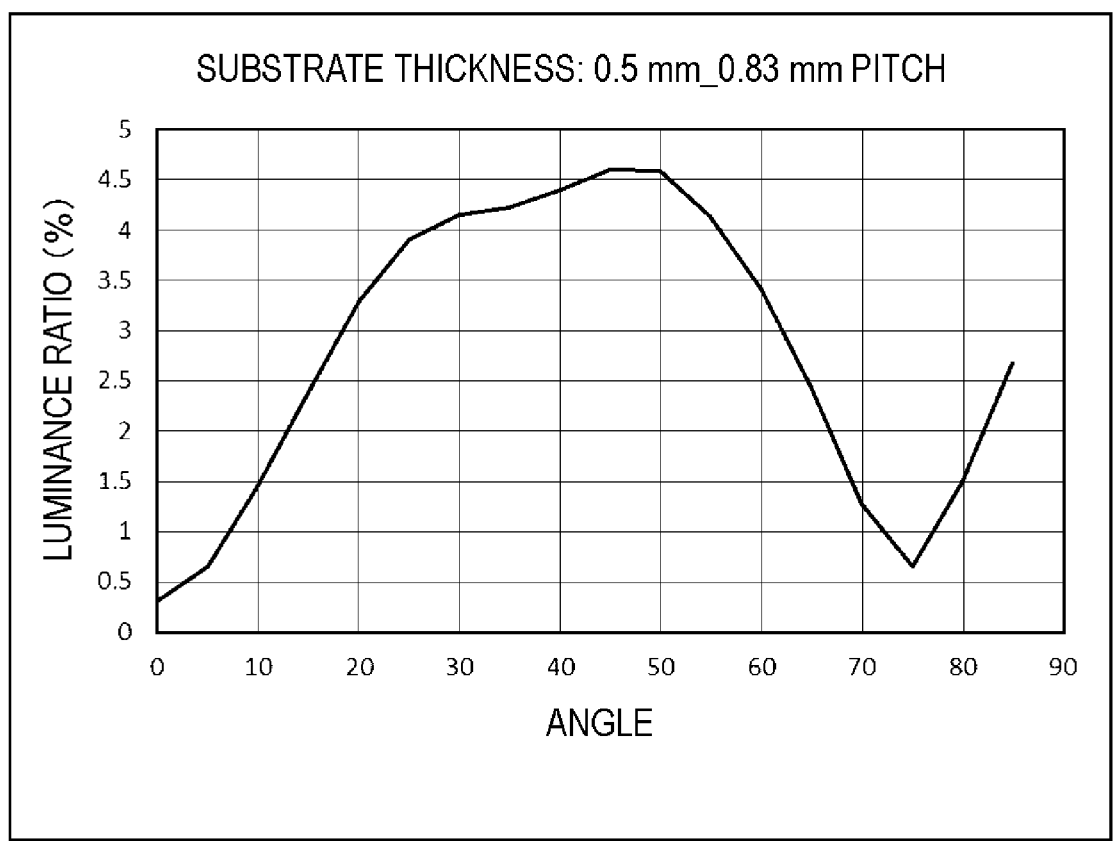
FIG. 18 is a diagram showing a relationship between the radiation angle of leaking light and the amount of leaking light.
Figure 19:
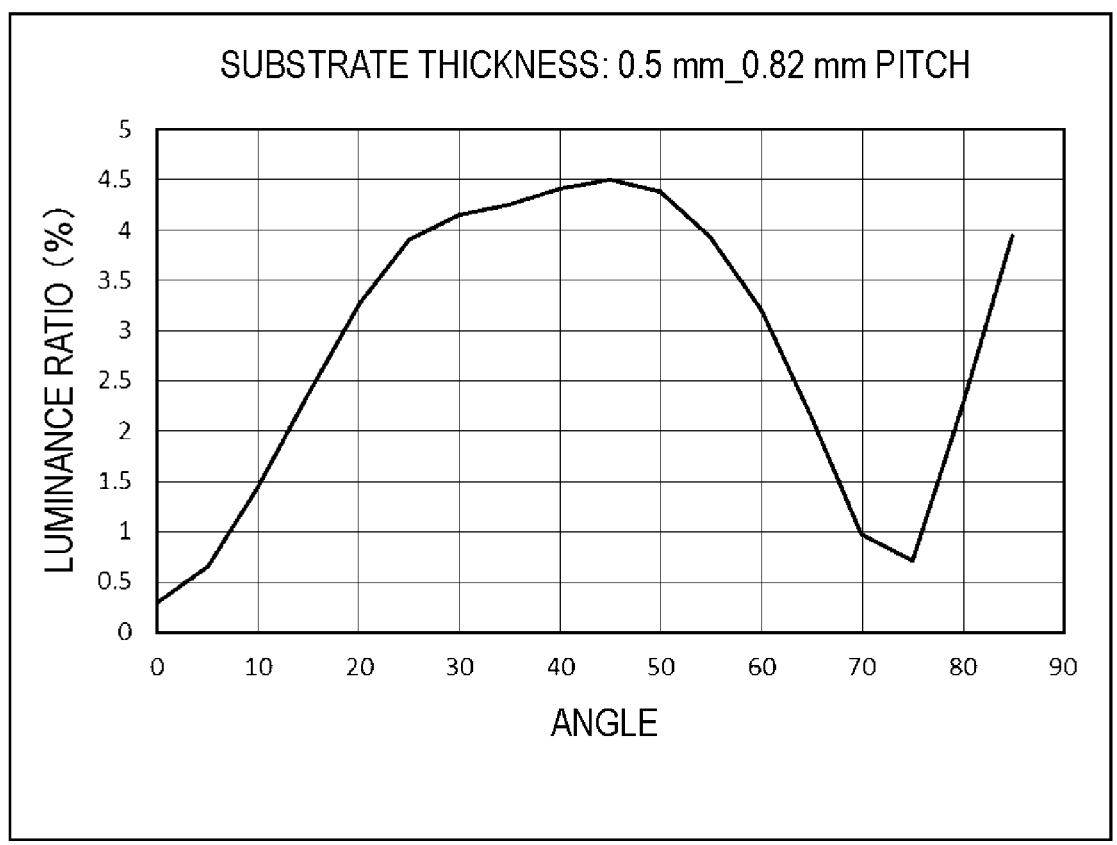
FIG. 19 is a diagram showing a relationship between the radiation angle of leaking light and the amount of leaking light.

FIG. 10 shows a simulation result of the ratio of light (leaking light) leaking from the first surface 100a side to the light Fresnel-reflected on the second surface 100b. In this figure, the ratio of the leaking light is shown as a value standardized with the amount of light radiated from the light-emitting portion 140 toward the second surface 100b at the angle being 1. For example, in FIG. 5, the leaking light at an emission angle of θ=70° is standardized with the amount of light radiated from the light-emitting portion 140 at an angle $θ_1$ being 1, and the leaking light at an emission angle of θ=90° is standardized with the amount of light radiated from the light-emitting portion 140 at an angle $θ_2$ being 1. From 0° to 40° of the angle θ (emission angle) in FIG. 5, the leaking light is very small. When the angle θ exceeds 40°, the leaking light gradually increases, and when the angle θ exceeds 60°, the leaking light rapidly increases. When the angle θ exceeds 70°, the ratio of the leaking light exceeds 0.1. As described above, the light radiated to the outside of the light-emitting device 10 from the first surface 100a side is particularly strong when the radiation angle is 70° or greater (the upper limit is theoretically 90°). Therefore, it is important to reduce the component of the leaking light radiated in a direction at an angle of θ=70° to 90°.

Furthermore, when the angle θ exceeds 80°, the ratio of the leaking light exceeds 0.2. As the angle θ approaches 90°, the possibility that leaking light enters the human eye is reduced. From this, it is particularly important to reduce the component of the leaking light emitted in a direction at an angle of θ=80°.

Although the illustration of the sealing portion 200 is omitted in FIG. 5, the actual radiation angle θ is a radiation angle of light radiated from the sealing portion 200 to the air. The radiation angle θ of the light radiated to the air from the sealing portion 200, however, becomes the same value as the radiation angle of the light radiated from the first surface 100a, assuming that the first surface 100a of the substrate 100 is in contact with the air.

Therefore, in the present embodiment, the adjacent light-emitting portion 140 is disposed in at least a part of the region where the radiation angle θ mentioned above is 70° or greater. The second electrode 130 of the light-emitting portion 140 has a light-shielding property. Therefore, radiation of a portion of the light emitted from the light-emitting portion 140 from the first surface 100a side can be reduced.

More specifically, as illustrated in FIG. 5, first, assume light $l_1$ radiated from the end portion 141 of the light-emitting portion 140a (first light-emitting portion) opposite to the light-emitting portion 140b (second light-emitting portion) and reflected at the second surface 100b and radiated from the first surface 100a at a radiation angle of 70°. A first radiation position 172 is a position where the light $l_1$ reaches the first surface 100a. Next, assume light $l_2$ radiated from the end portion 142 of the light-emitting portion 140a closer to the light-emitting portion 140b and reflected at the second surface 100b and radiated from the first surface 100a at a radiation angle of 90°. A second radiation position 174 is a position where the light $l_2$ reaches the first surface 100a. The position of the first surface 100a from which the light radiated from the light-emitting portion 140a can be easily radiated is a position between the first radiation position 172 and the second radiation position 174. Here, at least a part of the second electrode 130 (that is, the light-shielding portion 102) of the light-emitting portion 140b is located between the first radiation position 172 and the second radiation position 174. Therefore, the amount of light emitted by the light-emitting portion 140 and radiated from the first surface 100a is reduced.

Here, the distance L1 from the end portion 141 of the light-emitting portion 140a to the first radiation position 172 is represented by Formula (2). Furthermore, the distance L2 from the end portion 142 of the light-emitting portion 140a to the second radiation position 174 is represented by Formula (3).

$$L_1 = 2t \times \tan θ_1 \quad (2)$$

$$L_2 = 2t \times \tan θ_2 \quad (3)$$

Where $\theta_1$ is $\sin^{-1}(1.0\times\sin(70°)/n)$, and $\theta_2$ is $\sin^{-1}(1.0\times\sin(90°)/n)$, as described above.

As illustrated in FIG. 6A, when the width of the second electrode 130 of the light-emitting portion 140b is wider than the interval between the first radiation position 172 and the second radiation position 174, the light-emitting portion 140b may cover the entire region 170 between the first radiation position 172 and the second radiation position 174. As illustrated in FIG. 6B, when the width of the second electrode 130 of the light-emitting portion 140b is narrower than the interval between the first radiation position 172 and the second radiation position 174, the entirety of the second electrode 130 in the width direction may be located in the region 170.

As illustrated in FIG. 6C, the first radiation position 172 may overlap with the second electrode 130 and the second radiation position 174 may not overlap with the second electrode 130. As illustrated in FIG. 6D, the second radiation position 174 may overlap with the second electrode 130 and the first radiation position 172 may not overlap with the second electrode 130.

Each of FIGS. 11 to 19 is a diagram showing a simulation result of the relationship between the amount of leaking light and the radiation angle (the angle e described above) of the leaking light when the thickness t of the substrate 100 made of glass is 0.5 mm. The ratio of the leaking light is indicated as a value standardized with the total value of the light radiated from the second surface 100b of the light-emitting device 10 in a range of the vertical direction ±2.5° being 100%. The distribution of the leaking light is calculated by integration with a subinterval of 5° (for example, integration in a range of −2.5° to 2.5°, or integration in a range of 2.5° to 7.5°). As shown in FIGS. 11 to 19, when the center-to-center distance (interval) P between adjacent light-emitting portions 140 (in other words, the interval between the light-emitting portion 140 and the light-shielding portion 102 adjacent thereto) differs by 0.01 mm, the amount of the leaking light varies greatly. When the interval P is inappropriate, the amount of the leaking light at an angle θ in a range of 70° to 90° cannot be reduced. On the other hand, when the interval P is appropriate, the amount of the leaking light at an angle θ in a range of 70° to 90° can be reduced.

Figure 20:
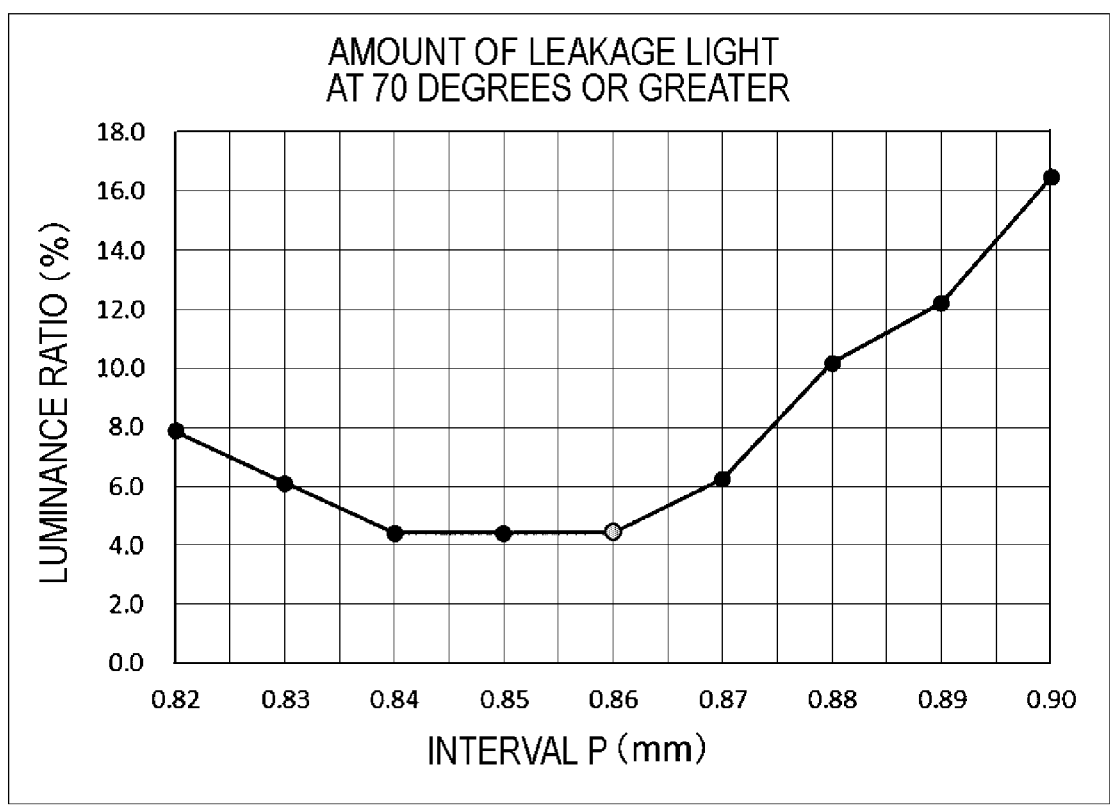
FIG. 20 is a graph showing a relationship between the amount of leaking light and the interval P.

FIG. 20 is a graph showing the relationship between the amount of the leaking light and the interval P at the angle θ in a range of 70° to 90° when the thickness t of the substrate 100 made of glass is 0.5 mm. It can be seen from this graph that when the thickness t of the substrate 100 is 0.5 mm, it is preferable that the interval P is 0.83 mm or greater and 0.87 mm or less.

In the examples illustrated in FIGS. 6B to 6D, the width of the portion of the region 170 covered with the second electrode 130 may be 50% or greater of the width of the region 170. Also, in any case, the light-emitting portion 140 may be disposed to block the light of θ=80° radiated by the adjacent light-emitting portion 140.

The light-emitting portions 140a and 140b may be adjacent to each other, and N (N is a natural number) light-emitting portions 140 may be located therebetween. Here, two problems occur when the pitch between the light-emitting portions 140 is increased. First, there is a large difference in luminance on the light-emitting surface of the light-emitting device 10 between portions with and without the light-emitting portion 140. In other words, when the pitch between the light-emitting portions 140 is increased, a luminance distribution is generated on the light-emitting surface of the light-emitting device 10. Second, since the area of the light-emitting portion 140 per unit area decreases, the amount of light required for each of the light-emitting portions 140 increases, and the load on the light-emitting portion 140 increases. In order to solve these problems, increasing the width of the light-emitting portion 140 maybe considered. In this case, however, the width of the second electrode 130 becomes wide, and the light-transmitting property of the light-emitting device 10 is decreased. In other words, the second electrodes 130 are easily visible, and the stripes become noticeable. Therefore, it is preferable that the pitch between the light-emitting portions 140 is within a certain range. For example, when the thickness t of the substrate 100 is 0.7 mm or less, for example, N is preferably 1. When the thickness t of the substrate 100 is greater than 0.7 mm and 1.5 mm or less, for example, N is preferably 2 or 3. Accordingly, even if the thickness t of the substrate 100 is greater than 0.7 mm, the problem that the luminance distribution is generated on the light-emitting surface of the light-emitting device 10 or the load on the light-emitting portion 140 is increased due to the too large pitch can be solved. The former case is a case of N=1 in the above-described Formula (1).

The widths of the plurality of light-emitting portions 140 are designed to be equal to one another. Therefore, the width of the light-emitting portion 140a is 95% or greater and 105% or less of the width of the light-emitting portion 140b. It is preferable that Formula (1) described above, that is, the relative positions of the light-emitting portion 140a and the light-emitting portion 140b are established for all sets of adjacent light-emitting portions 140, or all sets of two light-emitting portions 140 with N light-emitting portions therebetween (N is a natural number).

In other words, as illustrated in FIG. 4, assuming that a light-emitting portion 140c (third light-emitting portion/second light-shielding portion) is a light-emitting portion 140 opposite to the light-emitting portion 140b (second light-emitting portion/first light-shielding portion) relative to the light-emitting portion 140a (first light-emitting portion), the light-emitting portion 140c, the light-transmitting portion 106 (second light-transmitting portion), the light-emitting portion 140a, another light-transmitting portion 106 (first light-transmitting portion), and the light-emitting portion 140b are arranged in this order. In this case, the width of the light-emitting portion 140c and the width of the light-emitting portion 140b are both 95% or greater and 105% or less of the width of the light-emitting portion 140a. The interval between the center of the light-emitting portion 140a and the center of the light-emitting portion 140b is 95% or greater and 105% or less of the interval between the center of the light-emitting portion 140a and the center of the light-emitting portion 140c.

Figure 7:
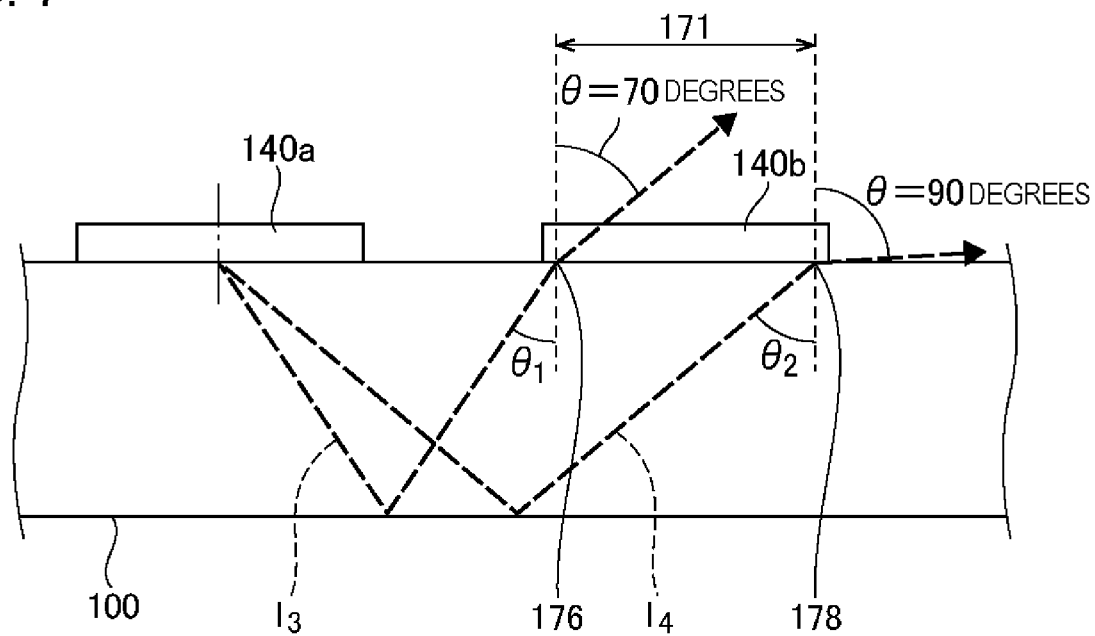
FIG. 7 is a diagram for explaining an arrangement interval between light-emitting portions.

As illustrated in FIG. 7, assume light $l_3$ radiated from the center of the light-emitting portion 140 in the width direction of the light-emitting portion 140 and reflected at the second surface 100b and radiated from the first surface 100a at a radiation angle of 70°. A third radiation position 176 is a position where the light $l_3$ reaches the first surface 100a. Next, assume light $l_4$ radiated from the center of the light-emitting portion 140a and reflected at the second surface 100b and radiated from the first surface 100a at a radiation angle of 90°. A fourth radiation position 178 is a position where the light $l_4$ reaches the first surface 100a. The position of the first surface 100a from which the light radiated from the light-emitting portion 140a can be easily radiated is a position of a region 171 between the third radiation position 176 and the fourth radiation position 178. Here, at least a part of the second electrode 130 (that is, the light-shielding portion 102) of the light-emitting portion 140b (preferably 50% or greater in the width direction of the second electrode 130) is located in the region 171. One of the methods for this is, for example, to set the interval P from the center of the light-emitting portion 140a to the center of the light-emitting portion 140b to satisfy Formula (1). Even in this case, the amount of light emitted by the light-emitting portion 140 and radiated from the first surface 100a is reduced.

The interval P may be set such that Formula (2) instead of Formula (1) is satisfied.

$$(1/N) \times 2t \times \tan\theta_1 \leq P \leq (1/N) \times 2t \times \tan\theta_2 \qquad (2)$$

In the present embodiment, a light-shielding layer (for example, a metal layer) may be provided on a part of the light-transmitting portion 106. In this case, the interval between the center of the light-shielding layer and the center of the light-emitting portion 140 is the same as the interval between the light-emitting portions 140 described above, and satisfies Formula (1).

Modification Example 1

Figure 8:
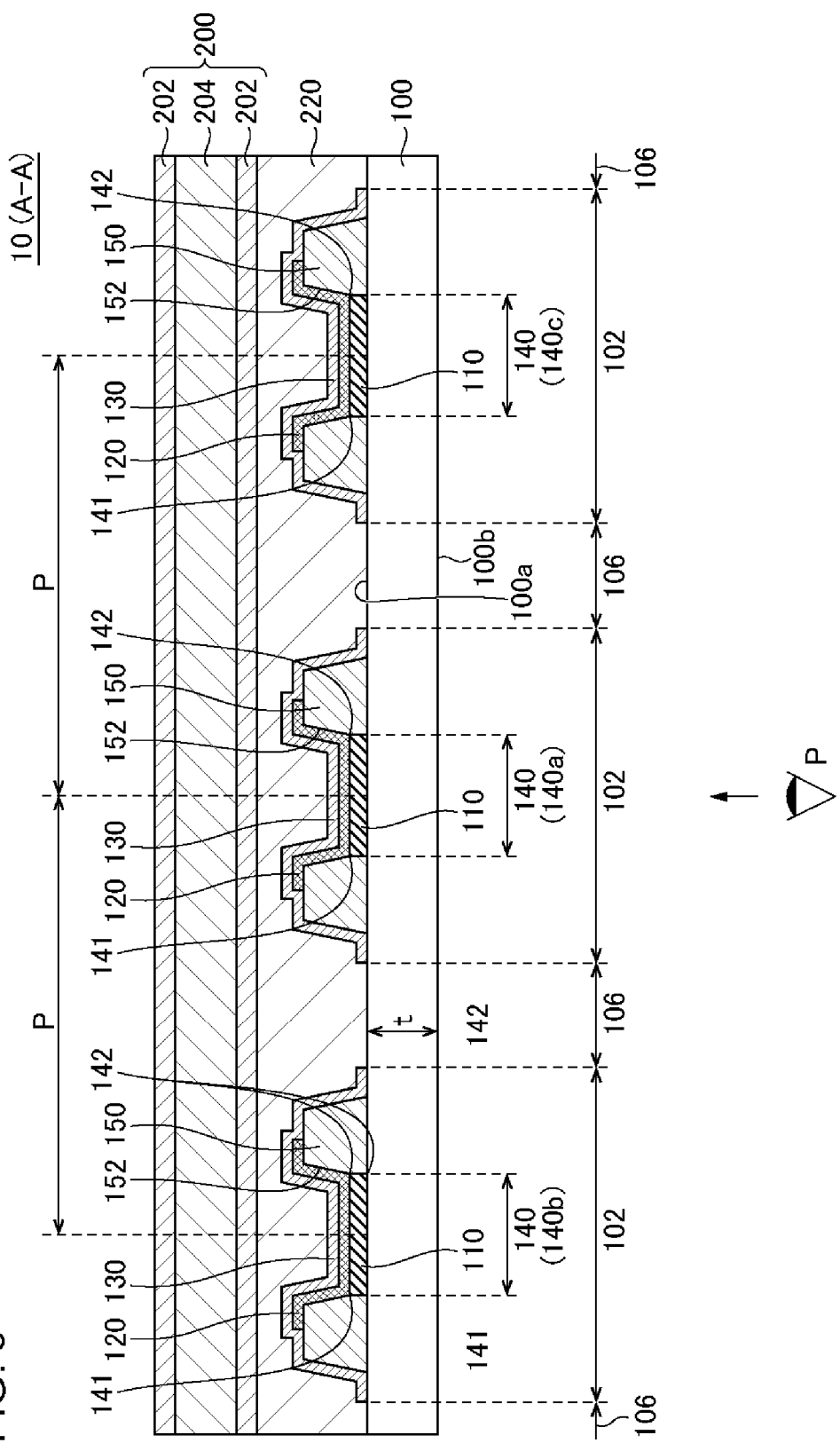
FIG. 8 is a cross-sectional view illustrating a configuration of a light-emitting device according to Modification Example 1.

FIG. 8 is a cross-sectional view illustrating the configuration of a light-emitting device 10 according to Modification Example 1, and corresponds to FIG. 4 of Embodiment 3. The light-emitting device 10 according to the present modification example has the same configuration as the light-emitting device 10 according to Embodiment 3 except that the end portion of the second electrode 130 is located closer to the light-transmitting portion 106 than to the end portion of the insulating film 150. Since the entirety of the insulating film 150 is covered with the second electrode 130, the light-emitting device 10 according to the present modification example does not have the light-transmitting portion 104 illustrated in FIG. 4.

Also in the present modification example, the position of the second electrode 130 (that is, the light-shielding portion 102) relative to the region 170 illustrated in FIG. 5 is as described in Embodiment 3. Therefore, the amount of light emitted by the light-emitting portion 140 and radiated from the first surface 100a is reduced.

Modification Example 2

Figure 9:
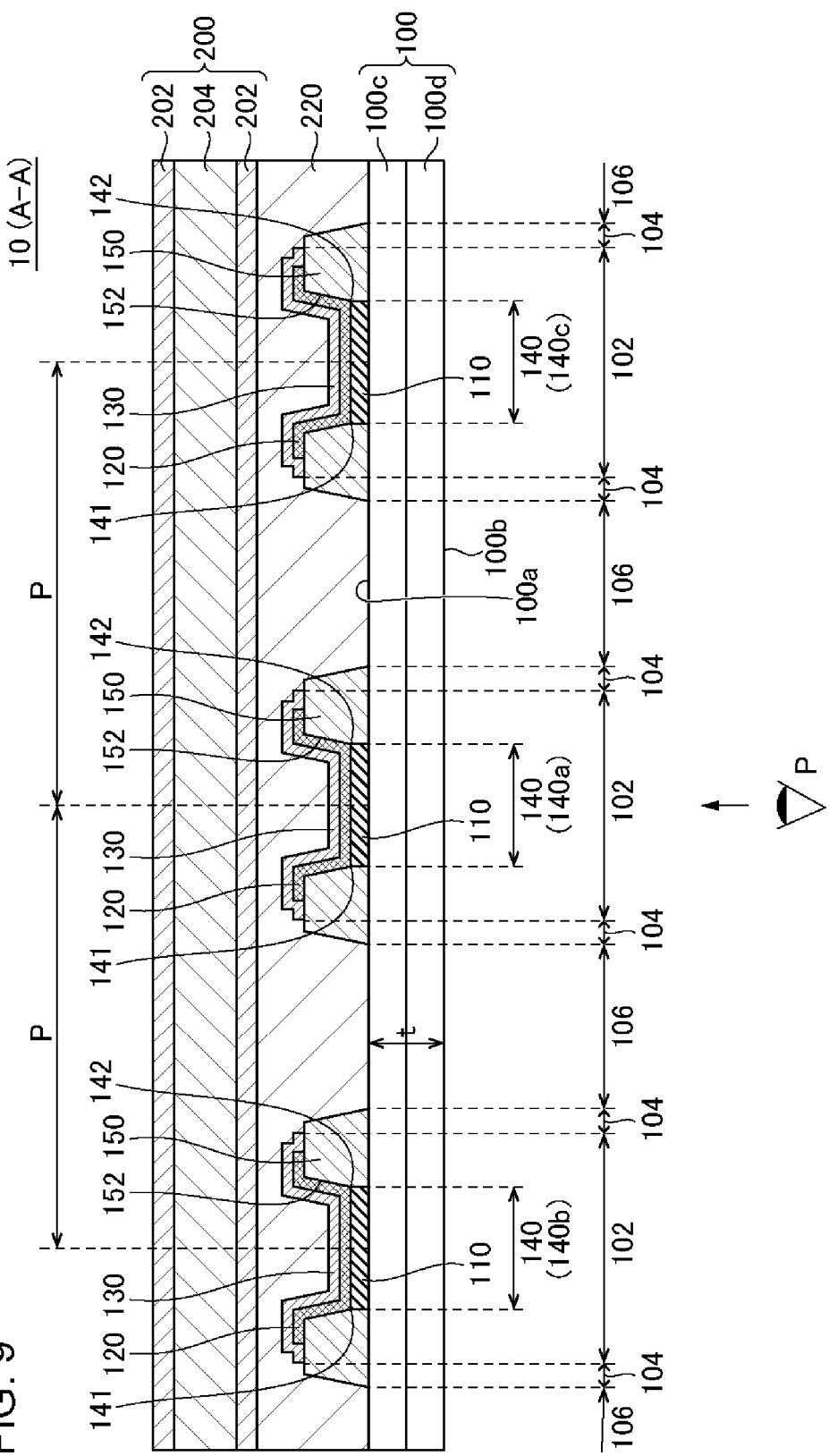
FIG. 9 is a cross-sectional view illustrating a configuration of a light-emitting device according to Modification Example 2.

FIG. 9 is a cross-sectional view illustrating the configuration of a light-emitting device 10 according to Modification Example 2, and corresponds to FIG. 4 of Embodiment 3. The light-emitting device 10 according to the present modification example has the same configuration as the light-emitting device 10 according to Embodiment 3 or Modification Example 1 except that the substrate 100 has a configuration in which a plurality of layers is laminated. At least two of the layers constituting the substrate 100 are formed using materials having different refractive indices. Therefore, the refractive indices of these two layers are different from each other.

In the example illustrated in FIG. 9, the substrate 100 has a configuration in which a first layer 100c and a second layer 100d are stacked. One of the layers constituting the substrate 100 may be a main layer, a so-called substrate, and the other layer may be a layer for coating the substrate. At least two or more of the layers constituting the substrate 100 may be so-called substrates. For example, in the example illustrated in FIG. 9, each of the first layer 100c and the second layer 100d may be a substrate. Furthermore, the second layer 100d may be a window glass of a structure (for example, a building) or a moving body (for example, a vehicle).

In the present embodiment, the refractive index n of the substrate 100 is a value obtained by weighted averaging of the refractive indices of the materials constituting the layers constituting the substrate 100 (or the refractive indices of the layers) using the thicknesses of the corresponding layers. Specifically, as the layers constituting the substrate 100 are layer 1 to layer m, the refractive index of a layer k is $n_k$, and the thickness of the layer k is $t_k$, the refractive index n of the substrate 100 is (the sum of $(n_k \times t_k)$ for k=1 to m)/(the sum of $t_k$ for k=1 to m). For example, when the substrate 100 is composed of the first layer 100c and the second layer 100d, the refractive index of the material forming the first layer 100c is $n_1$, the refractive index of the material forming the second layer 100d is $n_2$, the thickness of the first layer 100c is $t_1$, and the thickness of the second layer 100d is $t_2$, the refractive index n of the substrate 100 is $(n_1 \times t_1 + n_2 \times t_2)/(t_1 + t_2)$ Also in the present modification example, the amount of light emitted from the first surface 100a side in the light emitted by the light-emitting portion 140 is reduced.

Although the embodiments and examples have been described above with reference to the drawings, these are merely examples of the present invention, and various configurations except the above may be adopted.

Hereinafter, an example of a reference embodiment is added.

1. A light-emitting device including:
a substrate;
a first light-emitting portion located at a first surface side of the substrate;
a first light-shielding portion located at a position to cover light emitted from the first light-emitting portion and emitted to the first surface side of the substrate at at least any angle between 70° to 90°;
a first light-transmitting portion located between the first light-emitting portion and the first light-shielding portion.

2. The light-emitting device according to 1,
in which the first light-shielding portion is located anywhere from a position to cover light emitted from an end portion of the first light-emitting portion opposite to the first light-shielding portion and emitted to the first surface side of the substrate at an angle of 70°, to a position to cover light emitted from an end portion of the first light-emitting portion at the light-shielding portion side and emitted to the first surface side of the substrate at an angle of 90°.

3. The light-emitting device according to 2,
in which, Formula (1) below is satisfied where t is a thickness of the substrate, n is a refractive index of the substrate, and P is a distance from a center of the first light-emitting portion to a center of the first light-shielding portion;

$$(1/N) \times 2t \times \tan\theta_1 - (L/2) \leq P \leq (1/N) \times 2t \times \tan\theta_2 + (L/2) \qquad (1)$$

where $\theta_1$ is $\sin^{-1}(1.0 \times \sin(70°)/n)$, $\theta_2$ is $\sin^{-1}(1.0 \times \sin(90°)/n)$, and N is a natural number.

4. A light-emitting device including:
a substrate;
a first light-emitting portion located at a first surface side of the substrate;
a first light-shielding portion provided to the substrate; and
a first light-transmitting portion located between the first light-emitting portion and the first light-shielding portion,
in which, Formula (1) below is satisfied where t is a thickness of the substrate, n is a refractive index of the substrate, L is a width of the first light-shielding portion, and P is a distance from a center of the first light-emitting portion to a center of the first light-shielding portion;

$$(1/N) \times 2t \times \tan \theta_1 - (L/2) \leq P \leq (1/N) \times 2t \times \tan \theta_2 + (L/2) \quad (1)$$

where $\theta_1$ is $\sin^{-1}(1.0 \times \sin(70°)/n)$, $\theta_2$ is $\sin^{-1}(1.0 \times \sin(90°)/n)$, and N is a natural number.

5. A light-emitting device according to 4, in which Formula (2) below is satisfied.

$$(1/N) \times 2t \times \tan \theta_1 \leq P \leq (1/N) \times 2t \times \tan \theta_2 \quad (2)$$

6. The light-emitting device according to any one of 3 to 5, in which N is 1, 2, or 3.

7. The light-emitting device according to any one of 1 to 5, in which the first light-shielding portion is a metal electrode of a second light-emitting portion.

8. The light-emitting device according to 7, in which a width of the first light-emitting portion is 95% or greater and 105% or less of a width of the second light-emitting portion.

9. The light-emitting device according to 8, further including:
a third light-emitting portion and a second light-transmitting portion,
in which the third light-emitting portion, the second light-transmitting portion, the first light-emitting portion, the first light-transmitting portion, and the second light-emitting portion are arranged in this order,
a width of the third light-emitting portion is 95% or greater and 105% or less of the width of the first light-emitting portion, and
an interval between a center of the first light-emitting portion and a center of the second light-emitting portion is 95% or greater and 105% or less of an interval between the center of the first light-emitting portion and a center of the third light-emitting portion.

10. The light-emitting device according to any one of 1 to 9, further including:
a second light-shielding portion and a second light-transmitting portion,
in which the second light-shielding portion, the second light-transmitting portion, the first light-emitting portion, the first light-transmitting portion, and the first light-shielding portion are arranged in this order, and
a first interval that is an interval between the center of the first light-emitting portion and a center of the first light-shielding portion is 95% or greater and 105% or less of a second interval that is an interval between the center of the first light-emitting portion and a center of the second light-shielding portion.

11. The light-emitting device according to 10, in which the first interval is an interval to shield light of at least 80° emitted from the first light-emitting portion through reflection by a second surface of the substrate to the first surface side.

12. The light-emitting device according to any one of 1 to 11, in which the first light-emitting portion has a laminated structure of a light-transmissive first electrode, an organic layer, and a light-shielding second electrode.

13. The light-emitting device according to any one of 1 to 12, in which the substrate has a configuration in which at least a first layer and a second layer are laminated, and a refractive index of a material forming the first layer is different from a refractive index of a material forming the second layer.

This application claims priority to Japanese Patent Application No. 2017-60829 filed on Mar. 27, 2017, the entire disclosure of which is incorporated herein.

The invention claimed is:

1. An optical device comprising:
a light-emitting device comprising:
a substrate comprising a first surface and a second surface opposite to the first surface;
a first light-emitting portion located at the first surface side of the substrate;
a first light-shielding portion located at a position to cover (a) light emitted from the first light-emitting portion and (b) light emitted by a second light-emitting portion adjacent to the first light-emitting portion on the first surface side of the substrate, reflected by the second surface toward the first surface, and radiated from the first surface side of the substrate along at least any angle between 70° to 90° from a direction perpendicular to the first surface; and
a first light-transmitting portion located between the first light-emitting portion and the first light-shielding portion; and
a light-receiving element, the light-receiving element positioned at one of (i) a first position adjacent to and spaced apart from the first surface of the substrate and on a side of the first surface opposite the second surface of the substrate along the direction perpendicular to the first surface, and (ii) a second position adjacent to and spaced apart from the first surface of the substrate, on a side of the first surface opposite the second surface of the substrate, and diagonally offset from the direction perpendicular to the first surface.

2. The optical device according to claim 1,
wherein the first light-shielding portion is located anywhere from a position to cover light emitted from an end portion of the first light-emitting portion opposite to the first light-shielding portion and emitted to the first surface side of the substrate at an angle of 70°, to a position to cover light emitted from an end portion of the first light-emitting portion at the light-shielding portion side and emitted to the first surface side of the substrate at an angle of 90°.

3. The optical device according to claim 2,
wherein Formula (1) below is satisfied where t is a thickness of the substrate, n is a refractive index of the substrate, and P is a distance from a center of the first light-emitting portion to a center of the first light-shielding portion, $$(1/N) \times 2t \times \tan \theta_1 - (L/2) \leq P \leq (1/N) \times 2t \times \tan \theta_2 + (L/2) \quad (1)$$

where $\theta_1$ is $\sin^{-1}(1.0 \times \sin(70°)/n)$, $\theta_2$ is $\sin^{-1}(1.0 \times \sin(90°)/n)$, and N is a natural number.

4. An optical device comprising:
a light-emitting device comprising:
a substrate comprising a first surface and a second surface opposite to the first surface;
a first light-emitting portion located at the first surface side of the substrate;
a first light-shielding portion provided to the substrate to cover (a) light emitted from the first light-emitting portion and (b) light emitted by a second light-emitting portion adjacent to the first light-emitting portion on the first surface side of the substrate, reflected by the second surface toward the first surface, and radiated from the first surface side of the substrate; and a first light-transmitting portion located between the first light-emitting portion and the first light-shielding portion; and a light-receiving element, the light-receiving element positioned at one of (i) a first position adjacent to and spaced apart from the first surface of the substrate and on a side of the first surface opposite the second surface of the substrate along the direction perpendicular to the first surface, and (ii) a second position adjacent to and spaced apart from the first surface of the substrate, on a side of the first surface opposite the second surface of the substrate, and diagonally offset from the direction perpendicular to the first surface, wherein Formula (1) below is satisfied where t is a thickness of the substrate, n is a refractive index of the substrate, L is a width of the first light-shielding portion, and P is a distance from a center of the first light-emitting portion to a center of the first light-shielding portion;

$$(1/N) \times 2t \times \tan\theta_1 - (L/2) \leq P \leq (1/N) \times 2t \times \tan\theta_2 + (L/2) \quad (1)$$

where $\theta_1$ is $\sin^{-1}(1.0 \times \sin(70°)/n)$, $\theta_2$ is $\sin^{-1}(1.0 \times \sin(90°)/n)$, and N is a natural number.

5. The optical device according to claim 4,
wherein Formula (2) below is satisfied $$(1/N) \times 2t \times \tan\theta_1 \leq P \leq (1/N) \times 2t \times \tan\theta_2 \quad (2).$$

6. The optical device according to claim 3,
wherein N is 1, 2, or 3.

7. The optical device according to claim 1,
wherein the first light-shielding portion is a metal electrode of a second light-emitting portion.

8. The optical device according to claim 7,
wherein a width of the first light-emitting portion is 95% or greater and 105% or less of a width of the second light-emitting portion.

9. The optical device according to claim 8, further comprising:
a third light-emitting portion and a second light-transmitting portion,
wherein the third light-emitting portion, the second light-transmitting portion, the first light-emitting portion, the first light-transmitting portion, and the second light-emitting portion are arranged in this order,
a width of the third light-emitting portion is 95% or greater and 105% or less of the width of the first light-emitting portion, and
an interval between a center of the first light-emitting portion and a center of the second light-emitting portion is 95% or greater and 105% or less of an interval between the center of the first light-emitting portion and a center of the third light-emitting portion.

10. The optical device according to claim 1, further comprising:
a second light-shielding portion and a second light-transmitting portion,
wherein the second light-shielding portion, the second light-transmitting portion, the first light-emitting portion, the first light-transmitting portion, and the first light-shielding portion are arranged in this order, and
a first interval that is an interval between a center of the first light-emitting portion and a center of the first light-shielding portion is 95% or greater and 105% or less of a second interval that is an interval between the center of the first light-emitting portion and a center of the second light-shielding portion.

11. The optical device according to claim 10,
wherein the first interval is an interval to shield light of at least 80° emitted from the first light-emitting portion through reflection by a second surface of the substrate to the first surface side.

12. The optical device according to claim 1,
wherein the first light-emitting portion has a laminated structure of a light-transmissive first electrode, an organic layer, and a light-shielding second electrode.

13. The optical device according to claim 1,
wherein the substrate has a configuration in which at least a first layer and a second layer are laminated, and
a refractive index of a material forming the first layer is different from a refractive index of a material forming the second layer.

14. The optical device according to claim 4,
wherein the first light-shielding portion is a metal electrode of a second light-emitting portion.

15. The optical device according to claim 14,
wherein a width of the first light-emitting portion is 95% or greater and 105% or less of a width of the second light-emitting portion.

16. The optical device according to claim 15, further comprising:
a third light-emitting portion and a second light-transmitting portion,
wherein the third light-emitting portion, the second light-transmitting portion, the first light-emitting portion, the first light-transmitting portion, and the second light-emitting portion are arranged in this order,
a width of the third light-emitting portion is 95% or greater and 105% or less of the width of the first light-emitting portion, and
an interval between a center of the first light-emitting portion and a center of the second light-emitting portion is 95% or greater and 105% or less of an interval between the center of the first light-emitting portion and a center of the third light-emitting portion.

17. The optical device according to claim 4, further comprising:
a second light-shielding portion and a second light-transmitting portion,
wherein the second light-shielding portion, the second light-transmitting portion, the first light-emitting portion, the first light-transmitting portion, and the first light-shielding portion are arranged in this order, and
a first interval that is an interval between a center of the first light-emitting portion and a center of the first light-shielding portion is 95% or greater and 105% or less of a second interval that is an interval between the center of the first light-emitting portion and a center of the second light-shielding portion.

18. The optical device according to claim 17,
wherein the first interval is an interval to shield light of at least 80° emitted from the first light-emitting portion through reflection by a second surface of the substrate to the first surface side.

19. The optical device according to claim 4,
wherein the first light-emitting portion has a laminated structure of a light-transmissive first electrode, an organic layer, and a light-shielding second electrode.

20. The optical device according to claim 4,
wherein the substrate has a configuration in which at least a first layer and a second layer are laminated, and a refractive index of a material forming the first layer is different from a refractive index of a material forming the second layer.

\* \* \* \* \*